US012604626B2

(12) United States Patent
Yu et al.

(10) Patent No.: US 12,604,626 B2
(45) Date of Patent: Apr. 14, 2026

(54) DISPLAY APPARATUS INCLUDING BRANCH ELECTRODES CONNECTING GATE LINES TO GATE ELECTRODES

(71) Applicant: SAMSUNG DISPLAY CO., LTD.,
Yongin-si (KR)

(72) Inventors: Byungchang Yu, Yongin-si (KR);
Jangmi Kang, Yongin-si (KR); Minkyu Woo, Yongin-si (KR); Geunho Lee,
Yongin-si (KR)

(73) Assignee: SAMSUNG DISPLAY CO., LTD.,
Yongin-Si (KR)

( * ) Notice: Subject to any disclaimer, the term of this patent is extended or adjusted under 35 U.S.C. 154(b) by 0 days.

(21) Appl. No.: 18/890,324

(22) Filed: Sep. 19, 2024

(65) Prior Publication Data

US 2025/0248248 A1     Jul. 31, 2025

(30) Foreign Application Priority Data

Jan. 30, 2024     (KR) ........................ 10-2024-0014316

(51) Int. Cl.
*H10K 59/131*        (2023.01)
*G09G 3/3233*        (2016.01)
(Continued)

(52) U.S. Cl.
CPC ......... *H10K 59/131* (2023.02); *G09G 3/3233* (2013.01); *H10K 59/88* (2023.02);
(Continued)

(58) Field of Classification Search
CPC ...... H10K 59/131; H10K 59/88; H10K 59/35; G09G 3/3233; G09G 2300/0413;
(Continued)

(56) References Cited

U.S. PATENT DOCUMENTS 9,917,272 B2     3/2018   Voges et al.
2014/0353618 A1*  12/2014   Shim .................... G02B 5/0278
257/40

(Continued)

FOREIGN PATENT DOCUMENTS

KR          10-2023232 B1      9/2019
KR      10-2023-0066175 A     5/2023

*Primary Examiner* — Tom V Sheng
(74) *Attorney, Agent, or Firm* — F. CHAU & ASSOCIATES, LLC

(57)               ABSTRACT

A display apparatus includes a first pixel circuit including a first driving transistor and a first data-write transistor. A second pixel circuit includes a second driving transistor and a second data-write transistor. A first gate line and a second gate line each extend primarily in a first direction. A first data line extends primarily in a second direction crossing the first direction and is configured to transfer a first data signal to the first data-write transistor, a second data line extending primarily in the second direction and is configured to transfer a second data signal to the second data-write transistor. A first branch electrode electrically connects the first gate line to a gate electrode of the first data-write transistor. A second branch electrode electrically connects the second gate line to a gate electrode of the second data-write transistor.

29 Claims, 19 Drawing Sheets

(51) Int. Cl.
| | |
|---|---|
| *H10K 59/88* | (2023.01) |
| *G02F 1/1343* | (2006.01) |
| *G02F 1/1362* | (2006.01) |
| *H10K 59/35* | (2023.01) |

(52) U.S. Cl.
CPC .. *G02F 1/134309* (2013.01); *G02F 1/136227* (2013.01); *G09G 2300/0413* (2013.01); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2320/0233* (2013.01); *H10K 59/35* (2023.02)

(58) Field of Classification Search
CPC ... G09G 2300/0426; G09G 2300/0819; G09G 2300/0842; G09G 2300/0861; G09G 2310/08; G09G 2320/0233; G02F 1/134309; G02F 1/136227

USPC ........................................................ 345/690
See application file for complete search history.

(56) References Cited

U.S. PATENT DOCUMENTS

| | | | | |
|---|---|---|---|---|
| 2016/0018709 A1* | 1/2016 | Jeong | ................ | G02F 1/136213 |
| | | | | 349/38 |
| 2018/0011357 A1* | 1/2018 | Lee | ....................... | G02F 1/1368 |
| 2018/0095335 A1* | 4/2018 | Woo | ................. | G02F 1/136286 |
| 2018/0203272 A1* | 7/2018 | Cheng | ................... | G02F 1/1368 |
| 2019/0305071 A1 | 10/2019 | Yamamoto | | |
| 2020/0089066 A1* | 3/2020 | Li | ....................... | H10D 30/6757 |
| 2020/0381507 A1* | 12/2020 | Park | .................... | H10K 59/121 |
| 2022/0181425 A1* | 6/2022 | Sakai | .................. | H10D 86/441 |
| 2023/0143745 A1 | 5/2023 | Lee et al. | | |
| 2023/0206845 A1 | 6/2023 | Matsueda | | |
| 2023/0261006 A1* | 8/2023 | Xiao | ................. | G02F 1/134309 |
| | | | | 257/91 |
| 2025/0022415 A1* | 1/2025 | Cao | ....................... | G09G 3/3225 |

* cited by examiner

DISPLAY APPARATUS INCLUDING BRANCH ELECTRODES CONNECTING GATE LINES TO GATE ELECTRODES

CROSS-REFERENCE TO RELATED APPLICATION

This application claims priority under 35 U.S.C. § 119 to Korean Patent Application No. 10-2024-0014316, filed on Jan. 30, 2024, in the Korean Intellectual Property Office, the disclosure of which is incorporated by reference herein in its entirety.

TECHNICAL FIELD

The present disclosure relates to a display apparatus and, more specifically, to a.

DISCUSSION OF THE RELATED ART

Generally, a display apparatus may include a plurality of data lines, a plurality of gate lines, and a plurality of pixels that are electrically connected to the data lines and the gate line. To apply a data signal to each of the data lines, a data driver has a number of output lines that corresponds to a number of data lines. Additionally, a plurality of integrated circuits are needed to apply the data signals. Accordingly, manufacturing costs are increased by the large number of integrated circuits and data/gate lines.

SUMMARY

A display apparatus includes a first pixel circuit including a first driving transistor and a first data-write transistor, a second pixel circuit including a second driving transistor and a second data-write transistor, a first gate line and a second gate line each extending primarily in a first direction, a first data line extending primarily in a second direction crossing the first direction and configured to transfer a first data signal to the first data-write transistor, a second data line extending primarily in the second direction and configured to transfer a second data signal to the second data-write transistor, a first branch electrode electrically connecting the first gate line to a gate electrode of the first data-write transistor, and a second branch electrode electrically connecting the second gate line to a gate electrode of the second data-write transistor.

The display apparatus may further include a data driver configured to output data signals through a first output line, a data switch including a first switch and a second switch, wherein the first switch connects the first output line to the first data line in response to a first control signal, and the second switch connects the first output line to the second data line in response to a second control signal, and a controller configured to alternately output the first control signal and the second control signal for each line time of one frame.

A first gate signal applied to the first gate line may be synchronized with the first control signal, and a second gate signal applied to the second gate line may be synchronized with the second control signal.

The data driver may be configured to output a first data signal in synchronization with an output timing of the first control signal and output a second data signal in synchronization with an output timing of the second control signal.

The display apparatus may further include a third pixel circuit adjacent to the first pixel circuit in the second direction and sharing the first data line with the first pixel circuit, a fourth pixel circuit adjacent to the second pixel circuit in the second direction, sharing the second data line with the second pixel circuit, and arranged in a same row as the third pixel circuit, a first light-emitting diode electrically connected to the first pixel circuit, a second light-emitting diode electrically connected to the second pixel circuit, a third light-emitting diode electrically connected to the third pixel circuit, and a fourth light-emitting diode electrically connected to the fourth pixel circuit, wherein the first light-emitting diode and the third light-emitting diode may be configured to emit light of a same color, and the second light-emitting diode and the fourth light-emitting diode may be configured to emit light of a same color.

The first light-emitting diode and the third light-emitting diode may each be configured to emit light of a first color, and the second light-emitting diode and the fourth light-emitting diode may be configured to emit light of a second color that is different from the first color.

An emission area of the first light-emitting diode may overlap the first pixel circuit, and an emission area of the second light-emitting diode may overlap the second pixel circuit, and an emission area of the third light-emitting diode may be spaced apart from the third pixel circuit, and an emission area of the fourth light-emitting diode may be spaced apart from the fourth pixel circuit.

Each of the first light-emitting diode, the second light-emitting diode, the third light-emitting diode, and the fourth light-emitting diode may include a pixel electrode including a body and a connector extending from the body to a corresponding pixel circuit, a pixel electrode of the first light-emitting diode may further include a first dummy portion corresponding to a shape of a connector of the third light-emitting diode, and a pixel electrode of the second light-emitting diode may further include a second dummy portion corresponding to a shape of a connector of the fourth light-emitting diode.

The first light-emitting diode and the second light-emitting diode may be configured to emit light of a third color.

An emission area of the first light-emitting diode may overlap the first pixel circuit, an emission area of the second light-emitting diode may be spaced apart from the second pixel circuit, and an emission area of the third light-emitting diode may be spaced apart from the third pixel circuit, and an emission area of the fourth light-emitting diode may overlap the fourth pixel circuit.

Each of the first light-emitting diode, the second light-emitting diode, the third light-emitting diode, and the fourth light-emitting diode may include a pixel electrode including a body and a connector extending from the body to a corresponding pixel circuit, a pixel electrode of the first light-emitting diode may further include a first dummy portion corresponding to a shape of a connector of the second light-emitting diode, and a pixel electrode of the fourth light-emitting diode may further include a second dummy portion corresponding to a shape of a connector of the third light-emitting diode.

The third pixel circuit may include a third driving transistor, a third data-write transistor, and a first initialization transistor connected between the third driving transistor and an initialization voltage line, the fourth pixel circuit may include a fourth driving transistor, a fourth data-write transistor, and a second initialization transistor connected between the fourth driving transistor and the initialization voltage line, the first branch electrode may electrically connect the first gate line to a gate electrode of the first initialization transistor, and the second branch electrode may electrically connect the second gate line to a gate electrode of the second initialization transistor.

The gate electrode of the first initialization transistor and the gate electrode of the second initialization transistor may be disposed between the first gate line and the second gate line.

The gate electrode of the first data-write transistor, the gate electrode of the second data-write transistor, the gate electrode of the first initialization transistor, and the gate electrode of the second initialization transistor may each have an island shape.

The second gate line may have a zigzag shape.

A resistance of the first gate line may be equal to a resistance of the second gate line.

A display apparatus includes a first semiconductor layer including a first semiconductor pattern and a second semiconductor pattern spaced apart from each other in a first direction and symmetrical with respect to each other about a virtual line extending primarily in a second direction crossing the first direction, a first conductive layer disposed on the first semiconductor layer and including a first gate electrode and a second gate electrode, wherein the first gate electrode overlaps the first semiconductor pattern and the second gate electrode overlaps the second semiconductor pattern, a second conductive layer disposed on the first conductive layer and including a first gate line and a second gate line each extending primarily in the first direction, a second semiconductor layer disposed on the second conductive layer, a third conductive layer disposed on the second semiconductor layer and including a first branch electrode and a second branch electrode, wherein the first branch electrode electrically connects the first gate line to the first gate electrode, and the second branch electrode electrically connects the second gate line to the second gate electrode, and a fourth conductive layer disposed on the third conductive layer and including a first data line and a second data line each extending primarily in the second direction.

The display apparatus may further include a data driver configured to output data signals through a first output line, a data switch including a first switch and a second switch, wherein the first switch connects the first output line to the first data line in response to a first control signal, and the second switch connects the first output line to the second data line in response to a second control signal, and a controller configured to alternately output the first control signal and the second control signal for each line time of one frame.

A first gate signal applied to the first gate line may be synchronized with the first control signal, and a second gate signal applied to the second gate line may be synchronized with the second control signal.

The second gate line may have a zigzag shape.

A resistance of the first gate line may be equal to a resistance of the second gate line.

The display apparatus may further include a fifth conductive layer disposed on the fourth conductive layer and including a first pixel electrode electrically connected to the first semiconductor pattern and a second pixel electrode electrically connected to the second semiconductor pattern, wherein, when the first pixel electrode overlaps the first semiconductor pattern, the first pixel electrode may include a body, a connector extending from the body, and a dummy portion.

The fourth conductive layer may further include a driving voltage line extending primarily in the second direction, and the first pixel electrode may overlap the driving voltage line.

The second pixel electrode may include a body and a connector extending from the body, and the driving voltage line may include a shield overlapping the connector of the first pixel electrode.

A display apparatus includes a first data line and a second data line each extending primarily in a first direction, a first pixel circuit electrically connected to the first data line, a second pixel circuit electrically connected to the second data line, a first pixel electrode including a first body and a first connector extending from the first body and electrically connected to the first pixel circuit, and a second pixel electrode including a second body, a second connector extending from the second body and electrically connected to the second pixel circuit, and a first dummy portion having a shape corresponding to (e.g., a shape that is at least similar to) at least a portion of the first connector.

The display apparatus may further include a third pixel circuit electrically connected to the first data line, a fourth pixel circuit electrically connected to the second data line, a third pixel electrode including a third body, a third connector extending from the third body and electrically connected to the third pixel circuit, and a second dummy portion, and a fourth pixel electrode including a fourth body and a fourth connector extending from the fourth body and electrically connected to the fourth pixel circuit, wherein the second dummy portion may have a shape corresponding to (e.g., a shape that is at least similar to) at least a portion of the fourth connector.

A shape of the first pixel electrode and a shape of the fourth pixel electrode may be symmetrical with respect to each other about a virtual line extending in the first direction, and a shape of the second pixel electrode and a shape of the third pixel electrode may be symmetrical with respect to each other about the virtual line.

A display apparatus includes a first data line extending primarily in a first direction, a first pixel circuit and a second pixel circuit each electrically connected to the first data line and adjacent to each other in the first direction, a first pixel electrode including a first body and a first connector extending from the first body and electrically connected to the first pixel circuit, and a second pixel electrode including a second body, a second connector extending from the second body and electrically connected to the second pixel circuit, and a first dummy portion having a shape corresponding to (e.g., a shape that is at least similar to) at least a portion of the first connector.

The first body of the first pixel electrode and the second body of the second pixel electrode may be arranged in a staggered manner with respect to a virtual line extending in the first direction.

BRIEF DESCRIPTION OF THE DRAWINGS

The above and other aspects and features of certain embodiments of the disclosure will be more apparent from the following description taken in conjunction with the accompanying drawings, in which:

FIGS. 5A and 5B are views illustrating pixels and wirings according to an embodiment;

DETAILED DESCRIPTION

Figure 1:
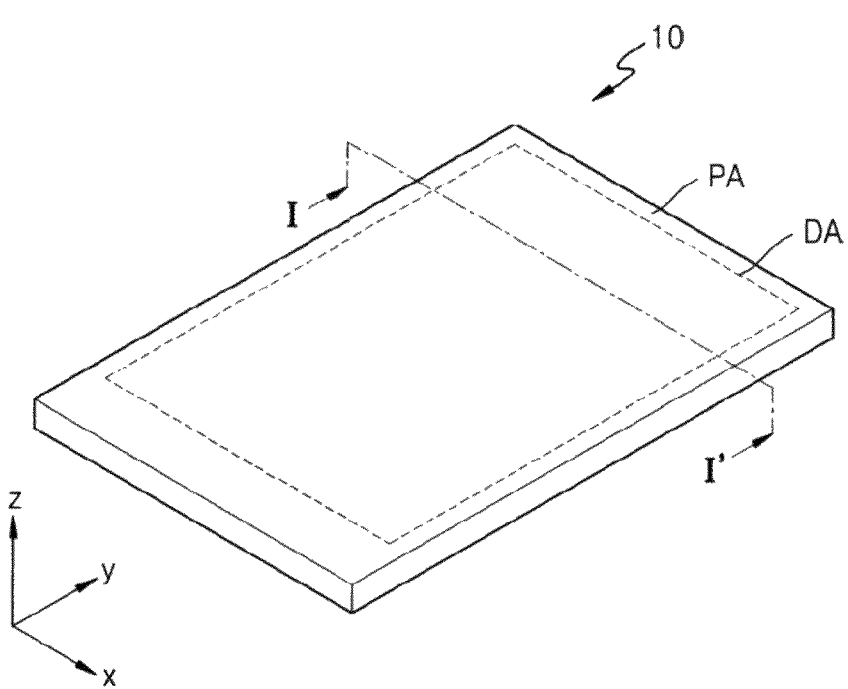
FIG. 1 is a schematic perspective view of a display apparatus according to an embodiment.

Reference will now be made in detail to embodiments, examples of which are illustrated in the accompanying drawings, wherein like reference numerals may refer to like elements throughout the specification and figures. In this regard, the present embodiments may have different forms and should not necessarily be construed as being limited to the descriptions set forth herein. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not necessarily limited to the following embodiments and may be embodied in various forms.

Hereinafter, embodiments will be described with reference to the accompanying drawings, wherein like reference numerals may refer to like elements throughout the specification and the figures. To the extent that an element is not described in detail with respect to one figure, it may be understood that the element is at least similar to a corresponding element that has been described elsewhere within the present disclosure with respect to another figure.

While such terms as "first" and "second" may be used to describe various components, such components must not necessarily be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. For example, for example, intervening layers, regions, or components may be present.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or element is referred to as being "electrically connected" to another layer, region, or element, it may be "directly electrically connected" to the other layer, region, or element or may be "indirectly electrically connected" to the other layer, region, or element with another layer, region, or element interposed therebetween. As an example, the case where X is electrically connected to Y may include the case where at least one element (e.g., a switch, a transistor, a capacitance element, an inductor, a resistance element, a diode, and the like) enabling electrical connection between X and Y is connected between X and Y.

The x-axis, the y-axis and the z-axis are not necessarily limited to three axes of the Cartesian rectangular coordinate system, and may be interpreted in a broader sense. For example, the x-axis, the y-axis, and the z-axis may be perpendicular to one another, or may represent different orientations that are not perpendicular to one another.

In the case where a certain embodiment may be implemented differently, a specific process order may be performed in the order different from the described order. As an example, two processes successively described may be simultaneously performed substantially and performed in the opposite order.

As used herein, when a wiring/line is referred to as "extending in a first direction or a second direction", it means that the wiring/line not only extends in a straight line shape but also extends in a zigzag or in a curve in the first direction or the second direction. Moreover, while it is understood that a wiring/line may be a two or three dimensional shape that extends in many directions at the same time (for example, a length, width, and height direction), as used herein, the phrase "extending primarily in a direction" means that the longest dimension of that shape, i.e., the length, extends in the aforementioned direction.

In the present specification, "in a plan view" means an objective portion is viewed in a direction approximately perpendicular to the front surface of a substrate, and "in a cross-sectional view" means a vertical cross-section of an objective portion when viewed from the side.

As used herein, when it is referred that a first element "overlaps" a second element, the first element is arranged above or below the second element.

In embodiments below, "ON" used in association with an element state may denote an active state of an element, and "OFF" may denote an inactive state of an element. "ON" used in association with a signal received by an element may denote a signal activating the element, and "OFF" may denote a signal inactivating the element. An element may be activated by a high-level voltage or a low-level voltage. As an example, a P-channel transistor may be activated by a low-level voltage, and an N-channel transistor may be activated by a high-level voltage. Therefore, it should be understood that the "on" voltages for a P-channel transistor (e.g., P-type transistor) and an N-channel transistor (e.g., N-type transistor) are opposite (e.g., low vs. high) voltage levels.

While each drawing may represent one or more particular embodiments of the present disclosure, drawn to scale, such that the relative lengths, thicknesses, and angles can be inferred therefrom, it is to be understood that the present invention is not necessarily limited to the relative lengths, thicknesses, and angles shown. Changes to these values may be made within the spirit and scope of the present disclosure, for example, to allow for manufacturing limitations and the like.

FIG. 1 is a schematic perspective view of a display apparatus 10 according to an embodiment.

Referring to FIG. 1, the display apparatus 10 includes a display area DA configured to display images and a peripheral area PA arranged around the display area DA. The display apparatus 10 may be configured to display images by using light emitted from a plurality of pixels arranged in the display area DA. The peripheral area PA is a region arranged around the display area DA and may be a kind of non-display area in which pixels are not arranged. The display area DA may be surrounded by the peripheral area PA either partially (e.g., proximate on one or more, but not all, sides) or entirely (e.g., proximate on all sides). Pads may be arranged in the peripheral area PA, wherein various wirings, a printed circuit board or a driver integrated circuit (IC) chip configured to transfer electric signals to the display area DA are attached to the pads.

Figure 2:
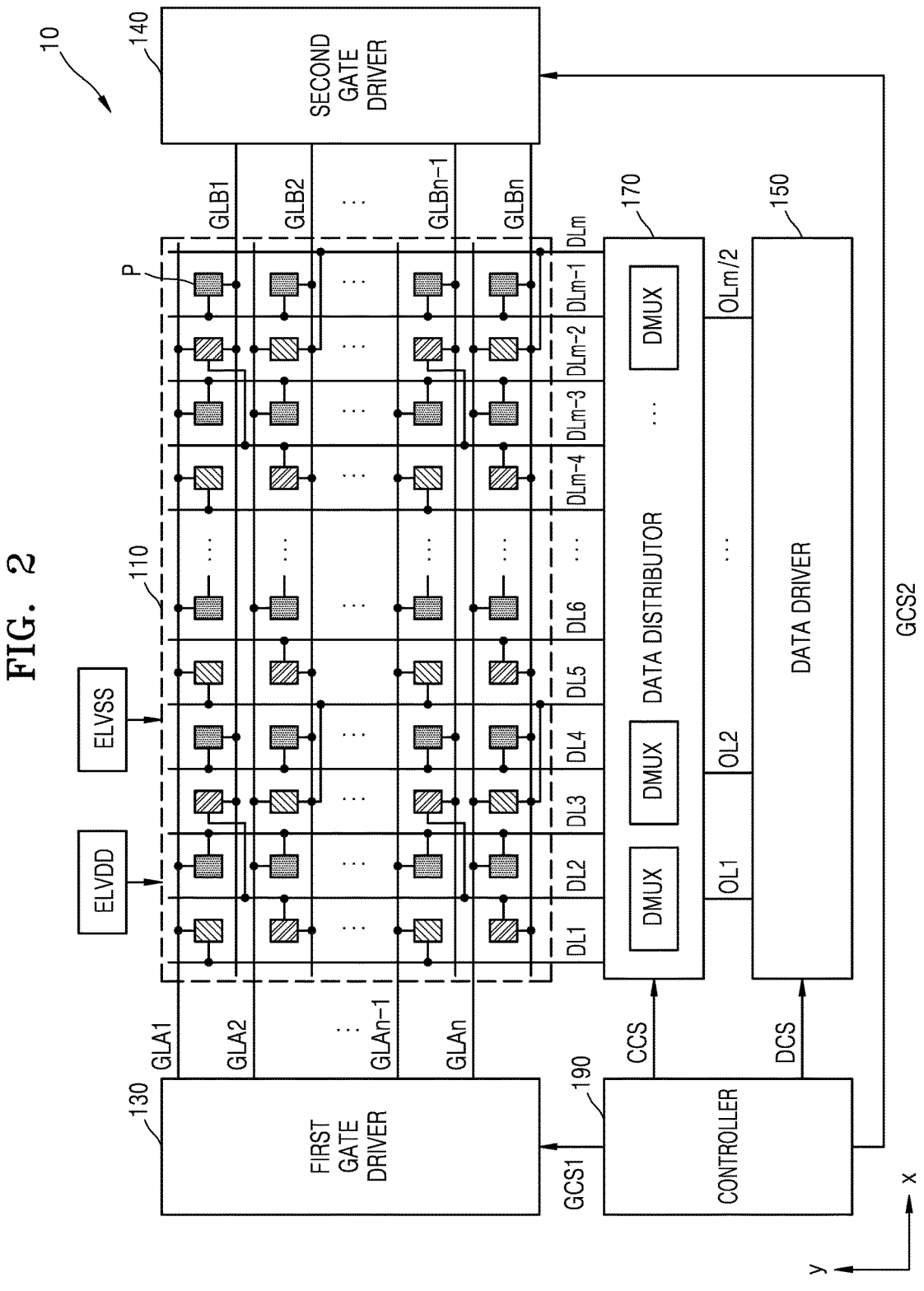
FIG. 2 is a schematic plan view of a display apparatus according to an embodiment.

FIG. 2 is a schematic plan view of the display apparatus 10 according to an embodiment.

Referring to FIG. 2, the display apparatus 10 may include a pixel unit 110, a first gate driver 130, a second gate driver 140, a data driver 150, a data switch (e.g., a data distributor) 170, and a controller 190.

The pixel unit 110 in which a plurality of pixels P are arranged may be disposed in the display area DA (see FIG. 1). The first gate driver 130, the second gate driver 140, the data driver 150, the data splitter 170, and the controller 190 may be disposed in the peripheral area PA (see FIG. 1). In an embodiment, the first gate driver 130 and the second gate driver 140 may face each other with the display area DA interposed therebetween.

Each of the plurality of pixels P may be connected to a corresponding gate line among a plurality of first gate lines GLA1 to GLAn and a plurality of second gate lines GLB1 to GLBn and connected to a corresponding data line among a plurality of data lines DL1 to DLm.

The plurality of data lines DL1 to DLm may respectively extend primarily in a second direction (e.g., a y direction, a column direction) and be connected to adjacent pixels P. Each of the plurality of first gate lines GLA1 to GLAn may extend primarily in a first direction (e.g., an x direction, a row direction) and be connected to some pixels P arranged in the same row, and each of the plurality of second gate lines GLB1 to GLBn may extend primarily in the first direction (e.g., the x direction, the row direction) and be connected to the other pixels P arranged in the same row.

In an embodiment, the plurality of data lines DL1 to DLm may include odd-numbered data lines DL1, DL3, DL5, . . . arranged in odd numbers and even-numbered data lines DL2, DL4, DL6, . . . arranged in even numbers. The plurality of first gate lines GLA1 to GLAn may be respectively connected to pixels P connected to the odd-numbered data lines DL1, DL3, DL5, . . . among the pixels P arranged in the same row, and the plurality of second gate lines GLB1 to GLBn may be respectively connected to pixels P connected to the even-numbered data lines DL2, DL4, DL6, . . . among the pixels P arranged in the same row.

The first gate driver 130 may be connected to the plurality of first gate lines GLA1 to GLAn and configured to generate first gate signals in response to a first gate driving control signal GCS1 from the controller 190 and sequentially supply the first gate signals to the first gate lines GLA1 to GLAn. When the first gate signals are sequentially supplied to the first gate lines GLA1 to GLAn, the pixels P connected to the odd-numbered data lines DL1, DL3, DL5, . . . may be selected on a row basis. The odd-numbered data lines DL1, DL3, DL5, . . . may be configured to respectively transfer data signals to the pixels P in the selected row.

The second gate driver 140 may be connected to the plurality of second gate lines GLB1 to GLBn and configured to generate second gate signals in response to a second gate driving control signal GCS2 from the controller 190 and sequentially supply the second gate signals to the second gate lines GLB1 to GLBn. When the second gate signals are sequentially supplied to the second gate lines GLB1 to GLBn, the pixels P connected to the even-numbered data lines DL2, DL4, DL6, . . . may be selected on a row basis. The even-numbered data lines DL2, DL4, DL6, . . . may be configured to respectively transfer data signals to the pixels P in the selected row.

A first gate signal may be a gate control signal configured to turn-on and turn-off a transistor connected to the first gate lines GLA1 to GLAn. A second gate signal may be a gate control signal configured to turn-on and turn-off a transistor connected to the second gate lines GLB1 to GLBn. A first gate signal and a second gate signal may be square wave signals in which an on-voltage by which a transistor may be turned on and an off-voltage by which a transistor may be turned off are repeated.

The data driver 150 may be connected to a plurality of output lines OL1 to OLm/2, and the plurality of output lines OL1 to OLm/2 may be connected to the data lines DL1 to DLm through the data distributor 170. The data driver 150 may be configured to convert an image signal into a data signal in the form of a voltage or current according to a data driving control signal DCS input from the controller 190. The data driver 150 may be configured to supply a data signal to the data distributor 170 through the output lines OL1 to OLm/2.

The data distributor 170 may be connected between the plurality of output lines OL1 to OLm/2 and the plurality of data lines DL1 to DLm. The data distributor 170 may include m/2 demultiplexers DMX including a plurality of switches. For example, the data distributor 170 may include the same number of demultiplexers DMX as the number of the plurality output lines OL1 to OLm/2. One end of the demultiplexer DMX may be connected to one corresponding output line among the plurality of output lines OL1 to OLm/2. In addition, the other end of the demultiplexer DMX may be connected to two data lines. The demultiplexer DMX may be configured to supply data signals to the two data lines, wherein the data signals are supplied from corresponding output lines. Because a smaller number of output lines are required than the number of data lines by using the demultiplexer DMX, the number of output lines connected to the data driver 150 is reduced. Accordingly, manufacturing costs may be reduced. The demultiplexer DMX may include two switches each connected to a corresponding output line and two data lines.

The controller 190 may be configured to generate a data driving control signal DCS, a first gate driving control signal GCS1, and a second gate driving control signal GCS2 in response to synchronization signals supplied from the outside. The controller 190 may be configured to output a data driving control signal DCS to the data driver 150, output a first gate driving control signal GCS1 to the first gate driver 130, and output a second gate driving control signal GCS2 to the second gate driver 140. The controller 190 may be configured to output a distribution control signal CCS to the data distributor 170, and the data distributor 170 may selectively connect the output lines OL1 to OLm/2 to the data lines DL1 to DLm in response to a distribution control signal CCS. The controller 190 may be configured to output two distribution control signals CCS to each demultiplexer DMX such that two data signals supplied to one output line are time-divided to two data lines. Two distribution control signals may be sequentially output so as not to overlap each other.

The first gate driver 130, the second gate driver 140, the data distributor 170, and the controller 190 may be directly formed on a substrate. The data driver 150 may be disposed on a flexible printed circuit board (FPCB) electrically connected to a pad arranged on one side of the substrate. In another embodiment, the data driver 150 may be directly disposed on the substrate using a chip on glass (COG) or chip on plastic (COP) method.

In the case where the display apparatus 10 is an organic light-emitting display apparatus, a first power voltage ELVDD and a second power voltage ELVSS may be supplied to the pixels P of the display apparatus 10. The first power voltage ELVDD may be a high-level voltage provided to a first electrode (e.g., a pixel electrode or an anode electrode) of a display element (e.g., a light-emitting diode) included in each pixel P. The second power voltage ELVSS may be a low-level voltage provided to a second electrode (e.g., an opposite electrode or a cathode electrode) of a display element included in each pixel P. The first power voltage ELVDD and the second power voltage ELVSS may be driving voltages configured to allow the plurality of pixels P to emit light.

Hereinafter, although an organic light-emitting display apparatus is described as an example of the display apparatus 10 according to an embodiment, the display apparatus according to the disclosure is not necessarily limited thereto. In another embodiment, the display apparatus 10 according to the disclosure may be an inorganic light-emitting display apparatus or a quantum-dot light-emitting display apparatus.

Figure 3:
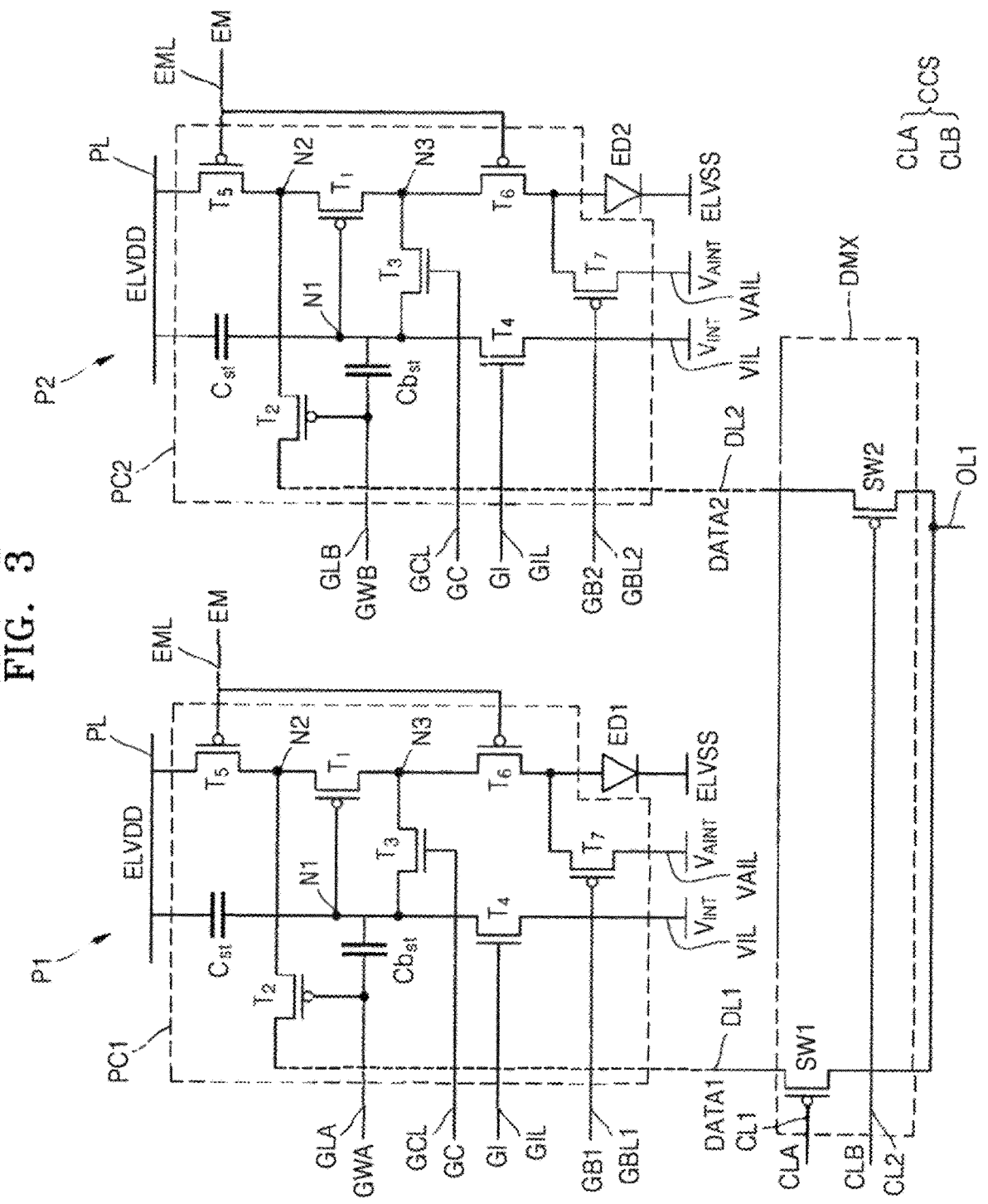
FIG. 3 is a schematic circuit diagram of pixels according to an embodiment.

FIG. 3 is a schematic circuit diagram of pixels according to an embodiment.

Referring to FIG. 3, a first pixel circuit PCA may be connected to a first light-emitting diode ED1 to implement light emission of a first pixel P1. A second pixel circuit PCB may be connected to a second light-emitting diode ED2 to implement light emission of a second pixel P2. The first pixel circuit PCA and the second pixel circuit PCB may be arranged in the same row and arranged to be adjacent to each other. In embodiments below, pixels in the same row denote pixels in which pixel circuits thereof are arranged in the same row.

Each of the first pixel circuit PCA and the second pixel circuit PCB may include first to seventh transistors T1, T2, T3, T4, T5, T6, and T7, a storage capacitor $C_{st}$, and a boost capacitor $C_{bst}$. Depending on the type (e.g., p-type or n-type) and/or an operation condition of a transistor, a first terminal of each of the first to seventh transistors T1, T2, T3, T4, T5, T6, and T7 may be a source or a drain, and a second terminal may be a terminal different from the first terminal. As an example, in the case where the first terminal is a source, the second terminal may be a drain. The first transistor T1 may be a driving transistor in which the magnitude of a source-drain current thereof is determined according to a gate-source voltage Vgs thereof, and the second to seventh transistors T2, T3, T4, T5, T6 and T7 may be switching transistors that are turned on/off according to a gate-source voltage, substantially a gate voltage.

The first pixel circuit PCA and the second pixel circuit PCB may be connected to a third gate line GCL configured to transfer a third gate signal GC, a fourth gate line GIL configured to transfer a fourth gate signal GI, an emission control line EML configured to transfer an emission control signal EM, a first initialization voltage line VIL configured to transfer a first initialization voltage $V_{INT}$, and a second initialization voltage line VAIL configured to transfer a second initialization voltage $V_{AINT}$. The first pixel circuit PCA may be connected to a first gate line GLA configured to transfer a first gate signal GWA, a fifth gate line GBL1 configured to transfer a fifth gate signal GB1, and a first data line DL_a configured to transfer a first data signal DATA1. The second pixel circuit PCB may be connected to a second gate line GLB configured to transfer a second gate signal GWB, a sixth gate line GBL2 configured to transfer a sixth gate signal GB2, and a second data line DL_b configured to transfer a second data signal DATA2.

In the first pixel circuit PCA, the first transistor T1 (e.g., the driving transistor) may include a gate connected to a first node N1, a first terminal connected to a second node N2, and a second terminal connected to a third node N3. The first transistor T1 may be configured to receive a first data signal DATA1 according to a switching operation of the second transistor T2 and supply a driving current to the first light-emitting diode ED1.

The second transistor T2 (e.g., a data-write transistor) may include a gate connected to the first gate line GLA, a first terminal connected to the first data line DL_a, and a second terminal connected to the second node N2. The second transistor T2 of the first pixel circuit PCA may be turned on according to a first gate signal GWA transferred through the first gate line GLA and configured to perform a switching operation of transferring a first data signal DATA1 transferred to the first data line DL_a to the second node N2.

The third transistor T3 (e.g., a compensation transistor) may include a gate connected to the third gate line GCL, a first terminal connected to the first node N1, and a second terminal connected to the third node N3. The third transistor T3 may be turned on according to a third gate signal GC to diode-connect the first transistor T1, wherein the third gate signal GC is transferred through the third gate line GCL.

The fourth transistor T4 (e.g., a first initialization transistor) may include a gate connected to the fourth gate line GIL, a first terminal connected to the first initialization voltage line VIL, and a second terminal connected to the first node N1. The fourth transistor T4 may be turned on according to a fourth gate signal GI to initialize a gate voltage of the first transistor T1 by transferring the first initialization voltage $V_{INT}$ to the gate of the first transistor T1, wherein the fourth gate signal GI is transferred through the fourth gate line GIL.

The fifth transistor T5 (e.g., a first emission control transistor) includes a gate, a first terminal, and a second terminal, wherein the gate is connected to the emission control line EML, the first terminal is connected to a driving voltage line PL, and the second terminal is connected to the second node N2. The sixth transistor T6 (e.g., a second emission control transistor) includes a gate, a first terminal, and a second terminal, wherein the gate is connected to the emission control line EML, the first terminal is connected to the third node N3, and the second terminal is connected to a pixel electrode of the first light-emitting element ED1. The fifth transistor T5 and the sixth transistor T6 are simultaneously turned on according to an emission control signal EM, and the driving current may flow through the first light-emitting element ED1, wherein the emission control signal EM is transferred through the emission control line EML.

The seventh transistor T7 (e.g., a second initialization transistor) includes a gate, a first terminal, and a second terminal, wherein the gate is connected to the fifth gate line GBL1, the first terminal is connected to the second terminal of the sixth transistor T6 and the pixel electrode of the first light-emitting element ED1, and the second terminal is connected to the second initialization voltage line VAIL. The seventh transistor T7 may be turned on according to a fifth gate signal GB 1 to initialize the pixel electrode of the first light-emitting diode ED1 by transferring the second initialization voltage VAINT to the pixel electrode of the first light-emitting diode ED1, wherein the fifth gate signal GB1 is transferred through the fifth gate line GBL1.

In an embodiment, the fifth gate line GBL1 may be a first gate line of a pixel circuit arranged in a previous row of the first pixel circuit PCA, and a fifth gate signal GB1 may be a first gate signal of a pixel circuit arranged in a previous row of the first pixel circuit PCA. Likewise, the sixth gate line GBL2 may be a second gate line of a pixel circuit arranged in a previous row of the second pixel circuit PCB, and a sixth gate signal GB2 may be a second gate signal of a pixel circuit arranged in a previous row of the second pixel circuit PCB.

The storage capacitor $C_{st}$ may include a first capacitor electrode and a second capacitor electrode, wherein the first capacitor electrode is connected to the first node N1, and the second capacitor electrode is connected to the driving voltage line PL. The storage capacitor $C_{st}$ may be configured to store a voltage corresponding to the difference between the voltage of the first node N1 and the first power voltage ELVDD supplied to the driving voltage line PL.

The boost capacitor $C_{bst}$ may include a third capacitor electrode and a fourth capacitor electrode, wherein the third capacitor electrode is connected to the first gate line GLA and the gate of the second transistor T2, and the fourth capacitor electrode is connected to the first node N1. The boost capacitor $C_{bst}$ may be configured to increase the voltage of the first node N1 when a first gate signal GWA supplied to the first gate line GLA is a turn-off voltage. When the voltage of the first node N1 is raised, a black grayscale (e.g., a darkest shade) may be clearly expressed.

Elements of the second pixel circuit PCB have a connection relationship equal or similar to that of elements of the first pixel circuit PCA. The second pixel circuit PCB may be connected to the second data line DL_b, the second gate line GLB, and the sixth gate line GBL2. In the second pixel circuit PCB, the first transistor T1 may be configured to receive a second data signal DATA2 and supply the driving current to the second light-emitting diode ED2 according to a switching operation of the second transistor T2. The seventh transistor T7 may be turned on according to a sixth gate signal GB2 to initialize the pixel electrode of the second light-emitting diode ED2 by transferring the second initialization voltage $V_{AINT}$ to the pixel electrode of the second light-emitting diode ED2, wherein the sixth gate signal GB2 is transferred through the sixth gate line GBL2. Hereinafter, repeated descriptions of the elements of the second pixel circuit PCB corresponding to the elements of the first pixel circuit PCA are omitted and may be assumed to be at least similar to corresponding elements described elsewhere within the specification.

The transistors of each of the first pixel circuit PCA and the second pixel circuit PCB may be P-type transistors or N-type transistors, or some transistors may be P-type transistors and other transistors may be N-type transistors. In an embodiment, the third transistor T3 and the fourth transistor T4 may be N-type transistors, and the rest of the transistors T1, T2, T5, T6, and T7 may be P-type transistors. The pixel circuit of FIG. 3 is provided as an example, and the pixel circuit included in the pixels according to the disclosure may be designed variously. As an example, each pixel circuit may include two transistors and only one storage capacitor.

The first data line DL_a and the second data line DL_b may be selectively connected to the first output line OL1 by the demultiplexer DMX. The demultiplexer DMX may include a first switch SW1 and a second switch SW2.

The first switch SW1 may be disposed between the first output line OL1 and the first data line DL_a. The first switch SW1 may be configured to connect the first output line OL1 to the first data line DL_a according to a first control signal CLA applied to the first control line CL1 to apply a first data signal DATA1 to the first data line DL_a. The data driver 150 (see FIG. 2) may be configured to output the first data signal DATA1 to the first output line OL1 in synchronization with an output timing of the first control signal CLA.

The second switch SW2 may be disposed between the first output line OL1 and the second data line DL_b. The second switch SW2 may be configured to connect the first output line OL1 to the second data line DL_b according to a second control signal CLB applied to the second control line CL2 to apply a second data signal DATA2 to the second data line DL_b. The data driver 150 (see FIG. 2) may be configured to output the second data signal DATA2 to the first output line OL1 in synchronization with an output timing of the second control signal CLB.

A distribution control signal CCS may include a first control signal CLA and a second control signal CLB. A first control signal CLA and a second control signal CLB may be alternately applied at different timings not to overlap each other.

A first gate signal GWA applied to the first gate line GLA may be synchronized with a first control signal CLA, and a second gate signal GWB applied to the second gate line GLB may be synchronized with a second control signal CLB.

Figure 4A:
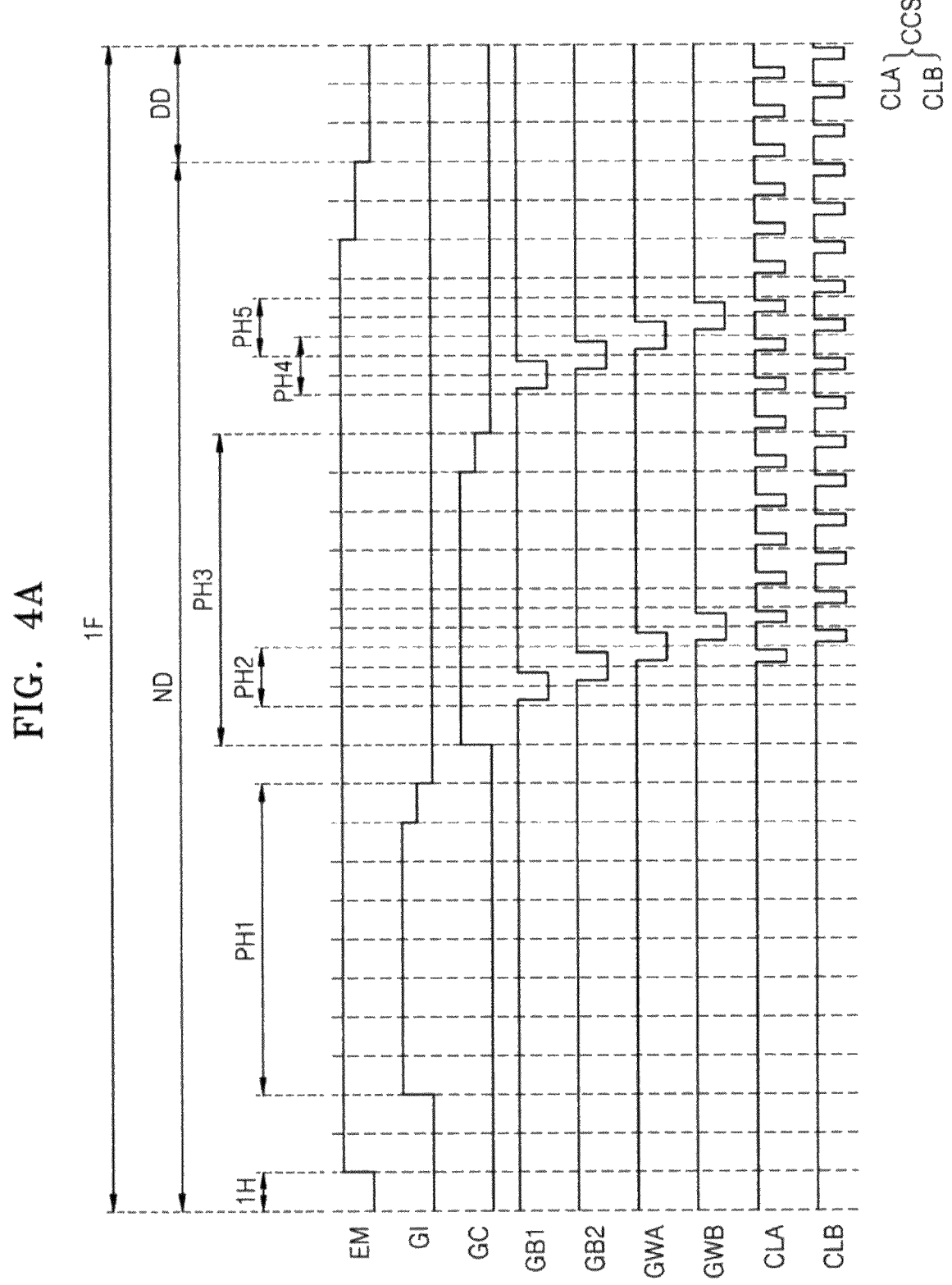
FIG. 4A is a timing diagram illustrating an operation of the pixels shown in FIG. 3.
Figure 4B:
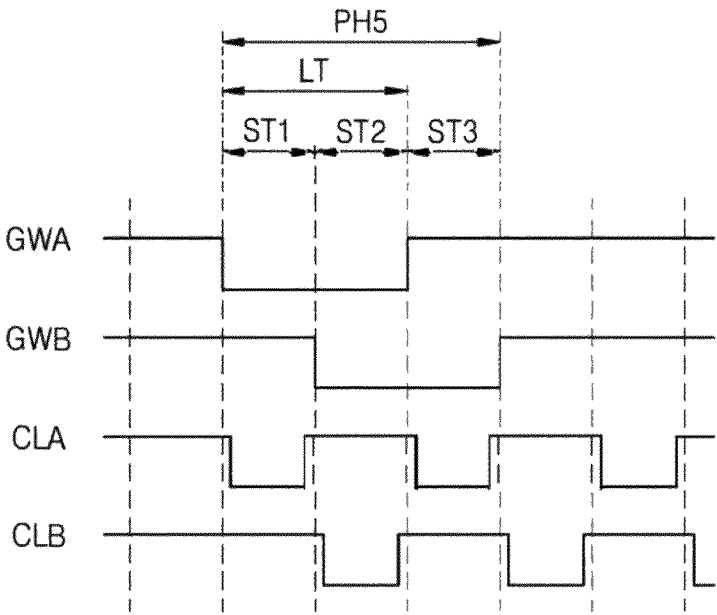
FIG. 4B is a timing diagram illustrating a data-write operation of the pixels shown in FIG. 3.

FIG. 4A is a timing diagram illustrating an operation of the pixels shown in FIG. 3, and FIG. 4B is a timing diagram illustrating a data-write operation of the pixels shown in FIG. 3.

Referring to FIGS. 3, 4A, and 4B together, pixels may include a non-emission period ND and an emission period DD for one frame 1F. The non-emission period ND may be a period in which the pixels are configured not to emit light, and the emission period DD may be a period in which the pixels are configured to emit light. The non-emission period ND may include a first period PH1, a second period PH2, a third period PH3, a fourth period PH4, a fifth period PH5, and a sixth period PH6.

Each of a first gate signal GWA, a second gate signal GWB, a third gate signal GC, a fourth gate signal GI, a fifth gate signal GB1, and a sixth gate signal GB2 may be a square wave having a high-level voltage (e.g., a first level voltage) in some period and having a low-level voltage (e.g., a second level voltage) in some period. Here, a high-level voltage may be an on-voltage configured to turn on a transistor, and a low-level voltage may be an off-voltage configured to turn off a transistor.

A fifth gate signal GB1 may be a first gate signal of a pixel circuit arranged in an (n−1)-th row when the first pixel circuit PCA is arranged in an n-th row. A sixth gate signal GB2 may be a second gate signal of a pixel circuit arranged in the (n−1)-th row when the second pixel circuit PCB is arranged in the n-th row.

The first period PH1 may be a first initialization period configured to initialize the first node N1 connected to the first transistor T1. For the first period PH1, a fourth gate signal GI of an on-voltage may be applied to the fourth gate line GIL. A first gate signal GWA, a second gate signal GWB, a third gate signal GC, a fifth gate signal GB1, and a sixth gate signal GB2 may be supplied as an off-voltage. The fourth transistor T4 of each of the first pixel circuit PCA and the second pixel circuit PCB may be turned on by a fourth gate signal GI. Accordingly, the first node N1, for example, a gate of the first transistor T1 of each of the first pixel circuit PCA and the second pixel circuit PCB, may be initialized to the first initialization voltage VINT.

The second period PH2 may be a second initialization period configured to initialize a pixel electrode of the first light-emitting diode ED1 and a pixel electrode of the second light-emitting diode ED2. For the second period PH2, a third gate signal GC of an on-voltage may be applied to the third gate line GCL, a fifth gate signal GB1 of an on-voltage may be applied to the fifth gate line GBL1, and a sixth gate signal GB2 of an on-voltage may be applied to the sixth gate line GBL2. When a fifth gate signal GB1 is applied, a first gate signal GWA, a second gate signal GWB, and a fourth gate signal GI may be supplied as an off-voltage. When a sixth gate signal GB2 is applied, a second gate signal GWB and a fourth gate signal GI may be supplied as an off-voltage. A fifth gate signal GB1, a sixth gate signal GB2, a first gate signal GWA, and a second gate signal GWB may be supplied with their phase shifted (e.g., phase delayed) at a preset interval (e.g., 0.5 horizontal period, 0.5 H).

The seventh transistor T7 of the first pixel circuit PCA may be turned on by a fifth gate signal GB1. The second initialization voltage VAINT may be transferred to the pixel electrode of the first light-emitting diode ED1 by the turned-on seventh transistor T7 of the first pixel circuit PCA. The seventh transistor T7 of the second pixel circuit PCB may be turned on by the sixth gate signal GB2. The second initialization voltage VAINT may be transferred to the pixel electrode of the second light-emitting diode ED2 by the turned-on seventh transistor T7 of the second pixel circuit PCB.

The third period PH3 may be a compensation period configured to compensate for a threshold voltage of the first transistor T1. For the third period PH3, a third gate signal GC of an on-voltage may be applied to the third gate line GCL. The third period PH2 may overlap the second period PH2. For a preset period (e.g., 1 H) of the third period PH3, a first gate signal GWA of an on-voltage may be applied to the first gate line GLA, and for a preset period (e.g., 1 H), a second gate signal GWB of an on-voltage may be applied to the second gate line GLB. A first gate signal GWA and a second gate signal GWB may be applied with their phase shifted at a preset interval (e.g., 0.5 H).

The third transistor T2 of each of the first pixel circuit PCA and the second pixel circuit PCB may be turned on by a third gate signal GC, and the first transistor T1 may be diode-connected. Then, the second transistor T2 of the first pixel circuit PCA is turned on by a first gate signal GWA, and accordingly, a compensation voltage may be applied to the first node N1 of the first pixel circuit PCA, wherein the compensation voltage is a voltage in which a threshold voltage of the first transistor T1 is compensated for from the first data signal DATA1. The compensation voltage may be applied to the first capacitor electrode of the storage capacitor $C_{st}$ of the first pixel circuit PCA, the first power voltage ELVDD may be applied to the second capacitor electrode, and charge corresponding to the difference between the first power voltage ELVDD and the compensation voltage may be stored in the storage capacitor $C_{st}$.

Likewise, the second transistor T2 of the second pixel circuit PCB is turned on by a second gate signal GWB, and accordingly, a compensation voltage may be applied to the first node N1 of the second pixel circuit PCB, wherein the compensation voltage is a voltage in which a threshold voltage of the first transistor Tl is compensated for from the second data signal DATA2. The compensation voltage may be applied to the first capacitor electrode of the storage capacitor $C_{st}$ of the second pixel circuit PCB, the first power voltage ELVDD may be applied to the second capacitor electrode, and charge corresponding to the difference between the first power voltage ELVDD and the compensation voltage may be stored in the storage capacitor $C_{st}$.

A period in which an on-voltage of a third gate signal GC is maintained (hereinafter, referred to as on-voltage period) may last 5 H or more, even after a first gate signal GWA of an on-voltage is reversed to an off-voltage. Accordingly, although the phase of a second gate signal GWB is applied at a preset interval delayed from the phase of the first gate signal GWA, the threshold voltage of the first transistor T1 of the second pixel circuit PCB is sufficiently compensated for, and thus, a deviation in brightness between a first pixel P1 and a second pixel P2 may be reduced.

The fourth period PH4 may be a third initialization period configured to initialize a pixel electrode of the first light-emitting diode ED1 and a pixel electrode of the second light-emitting diode ED2. For the third period PH3, a fifth gate signal GB1 of an on-voltage may be applied to the fifth gate line GBL1, and a sixth gate signal GB2 of an on-voltage may be applied to the sixth gate line GBL2. When a fifth gate signal GB1 is applied, a first gate signal GWA, a second gate signal GWB, and a fourth gate signal GI may be supplied as an off-voltage. When a sixth gate signal GB2 is applied, a second gate signal GWB and a fourth gate signal GI may be supplied as an off-voltage. The fourth period PH4 may partially overlap the fifth period PH5. A fifth gate signal GB1, a sixth gate signal GB2, a first gate signal GWA, and a second gate signal GWB may be supplied with their phase shifted (e.g., phase delayed) at a preset interval (e.g., 0.5 horizontal period, 0.5 H).

The seventh transistor T7 of the first pixel circuit PCA may be turned on by a fifth gate signal GB1. The second initialization voltage $V_{AINT}$ may be transferred to the pixel electrode of the first light-emitting diode ED1 by the turned-on seventh transistor T7 of the first pixel circuit PCA. The seventh transistor T7 of the second pixel circuit PCB may be turned on by the sixth gate signal GB2. The second initialization voltage $V_{AINT}$ may be transferred to the pixel electrode of the second light-emitting diode ED2 by the turned-on seventh transistor T7 of the second pixel circuit PCB.

The fifth period PH5 may be a data-write period in which the second transistor T2 of the first pixel circuit PCA and the second transistor T2 of the second pixel circuit PCB are turned on. For the fifth period PH5, a first gate signal GWA of an on-voltage may be applied to the first gate line GLA, and a second gate signal GWB of an on-voltage may be applied to the second gate line GLB. A first gate signal GWA and a second gate signal GWB may be applied with their phase shifted at a preset interval (e.g., 0.5 H).

The second transistor T2 of the first pixel circuit PCA may be turned on by a first gate signal GWA, and the turned-on second transistor T2 may be configured to transfer a first data signal DATA1 from the first data line DL_a to the first node N1 of the first pixel circuit PCA. The second transistor T2 of the second pixel circuit PCB may be turned on by a second gate signal GWB, and the turned-on second transistor T2 may be configured to transfer a second data signal DATA2 from the second data line DL_b to the second node N2 of the second pixel circuit PCB.

A first control signal CLA and a second control signal CLB may be distribution control signals CCS supplied from the controller 190 (see FIG. 2) to the demultiplexer DMX through the first control line CL1 and the second control line CL2. A first control signal CLA and a second control signal CLB may be gate control signals configured to control turned-on and turned-off of the first switch SW1 and the second switch SW2 of the demultiplexer DMX. A first control signal CLA and a second control signal CLB may be square wave signals in which an on-voltage configured to turn on the first switch SW1 and the second switch SW2, and an off-voltage configured to turn off the first switch SW1 and the second switch SW2 are repeated. An on-voltage period and an off-voltage period (e.g., a period in which an off-voltage is maintained) of a first control signal CLA and a second control signal CLB may be about 0.5 H. In an embodiment, an on-voltage of a first control signal CLA and a second control signal CLB may be a low-level voltage (e.g., a first level voltage), and an off-voltage may be a high-level voltage (e.g., a second level voltage).

A first control signal CLA and a second control signal CLB may have the same waveform and have their phases reversed. Timings at which voltage levels of a first control signal CLA and a second control signal CLB are reversed may be the same.

A first gate signal GWA may be synchronized with an output timing of a first control signal CLA, and a second gate signal GWB may be synchronized with an output timing of a second control signal CLB. An on-voltage period of a first gate signal GWA may be a line time LT. The line time LT may be the time required to write a data signal to pixels in one row. For example, the line time LT may be the total time required to write a first data signal DATA1 to the first pixel circuit PCA and write a second data signal DATA2 to the second pixel circuit PCB. The line time LT may be about 1 H.

The fifth period PH5 may be divided into a first sub-line time ST1, a second sub-line time ST2, and a third sub-line time ST3 based on a voltage level of a first control signal CLA. The line time LT may include the first sub-line time ST1 and the second sub-line time ST2.

During the first sub-line time ST1, a first control signal CLA of an on-voltage may be supplied to the first switch SW1 of the demultiplexer DMX, and a second control signal CLB of an off-voltage may be supplied to the second switch SW2 of the demultiplexer DMX. The first output line OL1 may be connected to the first data line DL_a through the demultiplexer DMX. The data driver 150 (see FIG. 2) may be configured to output the first data signal DATA1 to the first output line OL1 in synchronization with an output timing of the first control signal CLA. Accordingly, during the first sub-line time ST1, a first data signal DATA1 may be supplied to the first pixel circuit PCA through the first data line DL_a.

During the second sub-line time ST2, a second control signal CLB of an on-voltage may be supplied to the second switch SW2 of the demultiplexer DMX, and a first control signal CLA of an off-voltage may be supplied to the first switch SW1 of the demultiplexer DMX. The first output line OL1 may be connected to the second data line DL_b through the demultiplexer DMX. The data driver 150 (see FIG. 2) may be configured to output the second data signal DATA2 to the first output line OL1 in synchronization with an output timing of the second control signal CLB. Accordingly, during the second sub-line time ST2, a second data signal DATA2 may be supplied to the second pixel circuit PCB through the second data line DL_b.

During the third sub-line time ST3, a first control signal CLA of an on-voltage may be supplied to the first switch SW1 of the demultiplexer DMX, and a second control signal CLB of an off-voltage may be supplied to the second switch SW2 of the demultiplexer DMX. During the third sub-line time ST3, a data signal may not be supplied to the first pixel circuit PCA and the second pixel circuit PCB.

Data may be written to the first pixel circuit PCA and the second pixel circuit PCB within the same line time LT by applying a first gate signal GWA to the first pixel circuit PCA and applying a second gate signal GWB to the second pixel circuit PCB.

The emission period DD may be a period in which the first light-emitting diode ED1 and the second light-emitting diode ED2 are configured to emit light. During the emission period DD, an emission control signal EM may be applied to the emission control line EML. A first gate signal GWA, a second gate signal GWB, a third gate signal GC, a fourth gate signal GI, a fifth gate signal GB1, and a sixth gate signal GB2 may be off-voltages.

The fifth transistor T5 of each of the first pixel circuit PCA and the second pixel circuit PCB may be turned on by an emission control signal EM, and the first power voltage ELVDD may be supplied to the second node N2 by the turned-on fifth transistor T5. The sixth transistor T6 of each of the first pixel circuit PCA and the second pixel circuit PCB may be turned on by an emission control signal EM, and the driving current output by the first transistor T1 may be supplied to the first light-emitting diode ED1 and the second light-emitting diode ED2 through the sixth transistor T6. The driving current output by the first transistor T1 may have a magnitude corresponding to charge stored in the storage capacitor $C_{st}$.

Figure 5A:
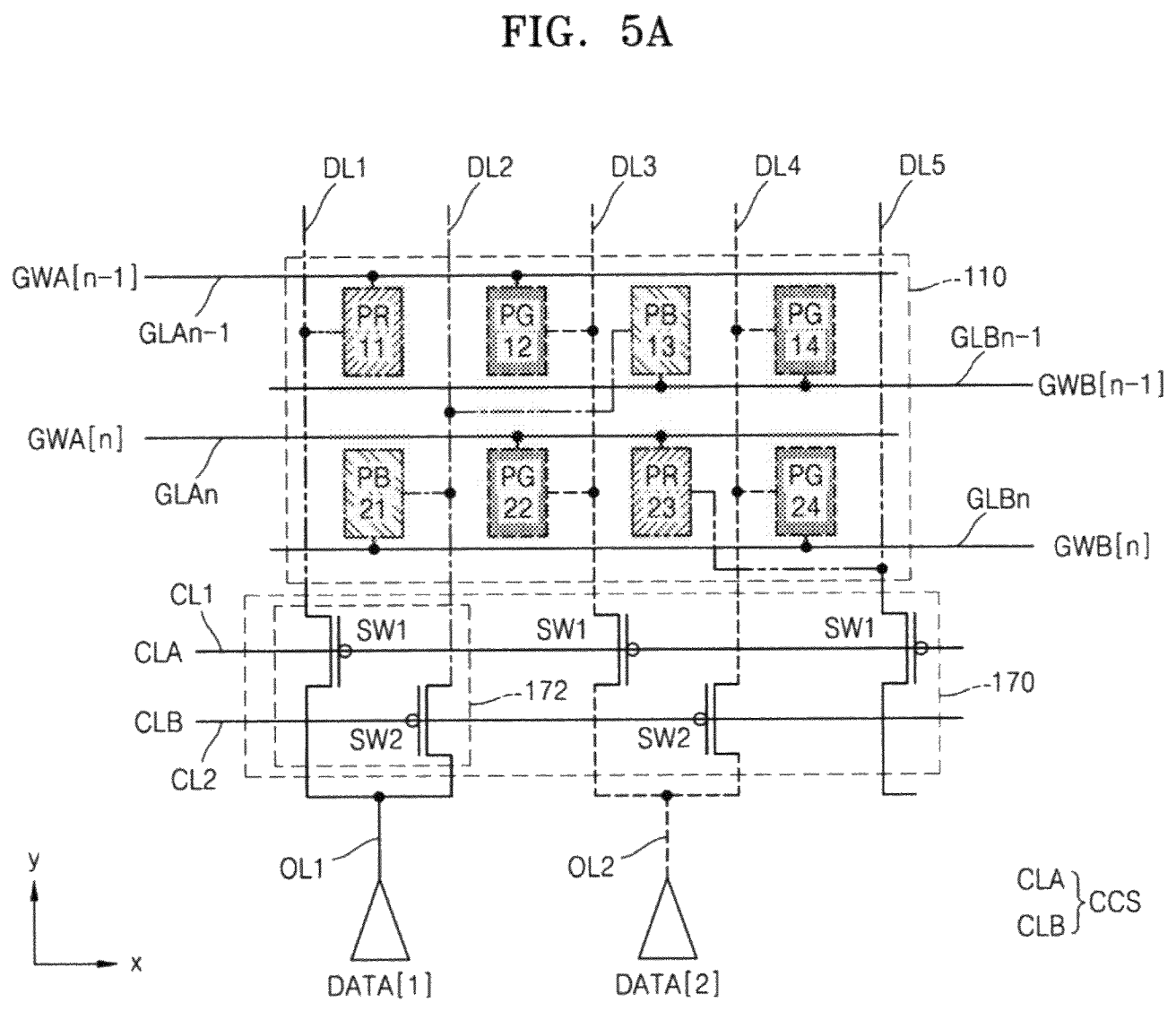
Figure 5B:
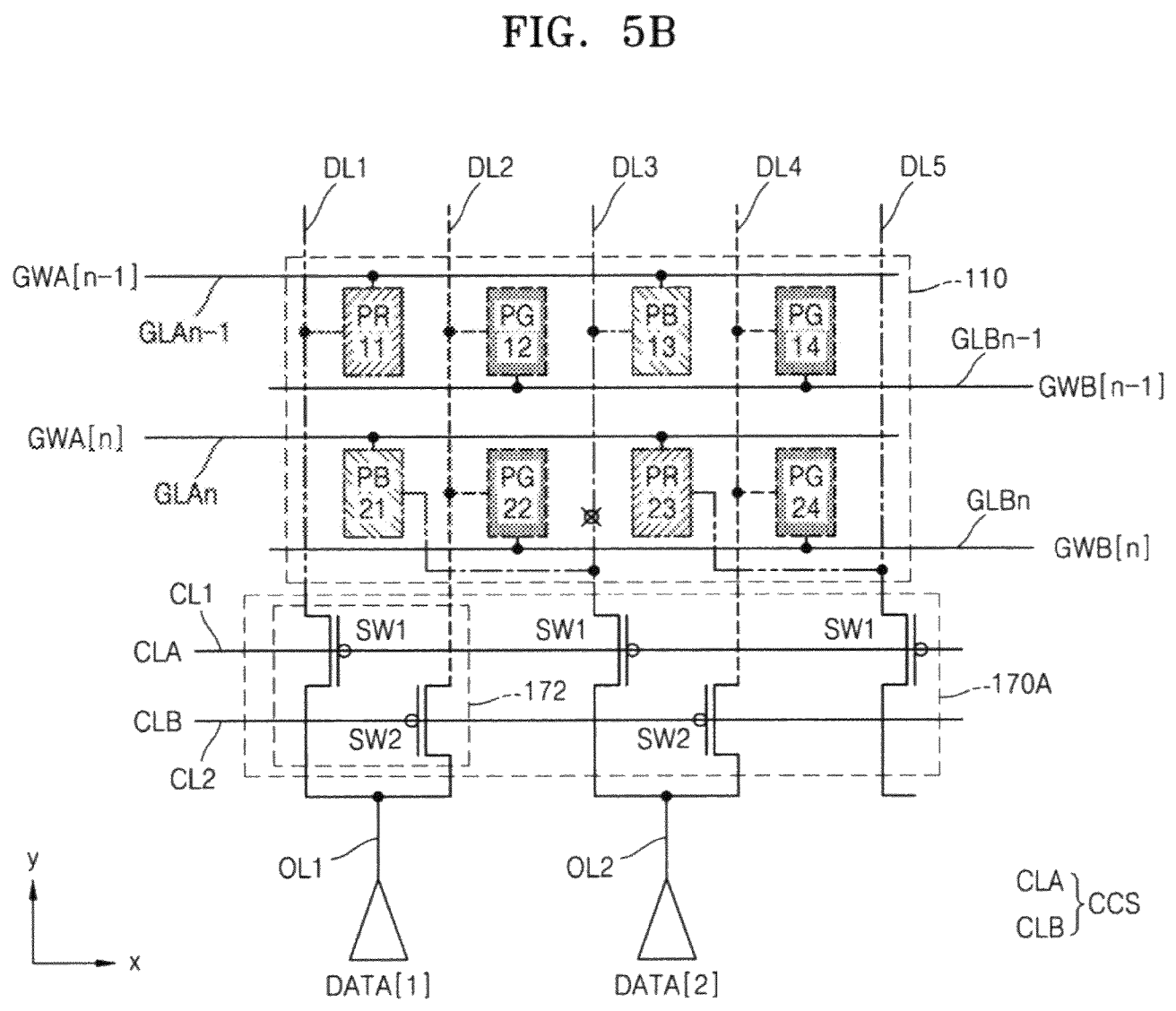

FIGS. 5A and 5B are views illustrating pixels and wirings according to an embodiment. FIGS. 5A and 5B show the position of a pixel with respect to an emission area of each of pixels. A position of a pixel circuit of each of the pixels may be different from a position of a corresponding emission area.

Referring to FIG. 5A, the data switch 170 may include a demultiplexer 172 configured to selectively connect an i-th output line to a pair of an adjacent (2i-1)-th data line and a 2i-th data line, and the pixel unit 110 may include a plurality of pixels.

As an example, the pixel unit 110 may include first pixels PR, second pixels PB, and third pixels PG configure to emit light of different colors. The first pixels PR may be red pixels configured to emit red light, the second pixels PB may be blue pixels configured to emit blue light, and the third pixels PG may be green pixels configured to emit green light.

A column in which the first pixels PR and the second pixels PB are alternately arranged, and a row in which the third pixels PG are repeatedly arranged may be alternately repeated in a row direction in the pixel unit 110. A plurality of gate lines and a plurality of data lines may be arranged in the pixel unit 110. As described above, the position of the pixels shown in FIG. 5A is shown based on the emission area of the pixels.

In an embodiment, the gate lines may be the first gate line GLA and the second gate line GLB shown in FIG. 3. For convenience of description, FIGS. 5A and 5B show first gate lines GLAn-1 and GLAn and second gate lines GLBn-H and GLBn in an (n−1)-th row and an n-th row and data lines DL1 to DL5 in first to fifth columns. The data lines may include odd-numbered data lines DL1, DL3, DL5, . . . and even-numbered data lines DL2, DL4, . . . . A pair of data lines connected to the demultiplexer 172 may be one odd-numbered data line and one even-numbered data line. Hereinafter, the demultiplexer 172 connected to the first output line OL1 is described as an example, and this is equally applicable to the demultiplexers 172 connected to the remaining output lines.

The demultiplexer 172 may include the first switch SW1 and the second switch SW2.

The first switch SW1 may be disposed between the first output line OL1 and the first data line DL1. The first switch SW1 may be a transistor including a gate, a first terminal, and a second terminal, wherein the gate is connected to the first control line CL1, the first terminal is connected to the first output line OL1, and the second terminal is connected to the first data line DL1. The first switch SW1 may be turned on by a first control signal CLA applied from the first control line CL1, may connect the first output line OL1 to the first data line DL1, and be configured to apply a data signal DATA[1] applied to the first output line OL1 to the first data line DL1.

The second switch SW2 may be disposed between the first output line OL1 and the second data line DL2. The second switch SW2 may be a transistor including a gate, a first terminal, and a second terminal, wherein the gate is connected to the second control line CL2, the first terminal is connected to the first output line OL1, and the second terminal is connected to the second data line DL2. The second switch SW2 may be turned on by a second control signal CLB applied from the second control line CL2, may connect the first output line OL1 to the second data line DL2, and be configured to apply a data signal DATA[1] applied to the first output line OL1 to the second data line DL2.

A distribution control signal CCS may include a first control signal CLA and a second control signal CLB. A first control signal CLA and a second control signal CLB may be alternately applied at different timings not to overlap each other.

Pixels connected to the same data line may be configured to emit light of the same color. As an example, a [1,1]-th pixel PR11 connected to the first data line DL1 may be configured to emit red light, a [2,1]-th pixel PB21 and a [1,3]-th pixel PB13 connected to the second data line DL2 may be configured to emit blue light, a [1,2]-th pixel PG12 and a [2,2]-th pixel PG22 connected to the third data line DL3 may be configured to emit green light, and a [1,4]-th pixel PG14 and a [2,4]-th pixel PG24 connected to the fourth data line DL4 may be configured to emit green light.

Pixels connected to the odd-numbered data lines DL1, DL3, DL5, . . . may be connected to the first gate line GLA, and pixels connected to the even-numbered data lines DL2, DL4, . . . may be connected to the second gate line GLB. As an example, the [1,1]-th pixel PR11, the [1,2]-th pixel PG12, the [2,2]-th pixel PG22, and the [2,3]-th pixel PR23 may be connected to the first gate line GLA. The [1,3]-th pixel PB13, the [1,4]-th pixel PG14, the [2,1]-th pixel PB21, and the [2,4]-th pixel PG24 may be connected to the second gate line GLB.

A data signal DATA[1] applied to the first output line OL1 may include a red data signal applied to the pixels PR11 connected to the first data line DL1, and a blue data signal applied to the pixels PB13 and PB21 connected to the second data line DL2. A data signal DATA[2] applied to the second output line OL2 may include a first green data signal applied to the pixels PG12 and PG22 connected to the third data line DL3, and a second green data signal applied to the pixels PG14 and PG24 connected to the fourth data line DL4.

An embodiment of FIG. 5B is similar to the embodiment of FIG. 5A and may be different from the embodiment of FIG. 5A in the connection of data lines and the pixels. Hereinafter, repeated detailed descriptions are omitted and may be assumed to be at least similar to corresponding elements described elsewhere within the specification and the connection of data lines and the pixels are mainly described.

Pixels connected to the same data line may be configured to emit light of the same color. As an example, a [1,1]-th pixel PR11 connected to the first data line DL1 may be configured to emit red light, a [1,2]-th pixel PG21 and a [2,2]-th pixel PG22 connected to the second data line DL2 may be configured to emit green light, a [1,3]-th pixel PB13 and a [2,1]-th pixel PB21 connected to the third data line DL3 may be configured to emit blue light, and a [1,4]-th pixel PG14 and a [2,4]-th pixel PG24 connected to the fourth data line DL4 may be configured to emit green light.

Pixels connected to the odd-numbered data lines DL1, DL3, DL5, . . . may be connected to the first gate line GLA, and pixels connected to the even-numbered data lines DL2, DL4, . . . may be connected to the second gate line GLB. As an example, the [1,1]-th pixel PR11, the [1,3]-th pixel PB13, the [2,1]-th pixel PB21, and the [2,3]-th pixel PR23 may be connected to the first gate line GLA. The [1,2]-th pixel PG12, the [1,4]-th pixel PG14, the [2,2]-th pixel PG22, and the [2,4]-th pixel PG24 may be connected to the second gate line GLB.

A data signal DATA[1] applied to the first output line OL1 may include a red data signal applied to the pixels PR11 connected to the first data line DL1, and a first green data signal applied to the pixels PG12 and PG22 connected to the second data line DL2. A data signal DATA[2] applied to the second output line OL2 may include a blue data signal applied to the pixels PB13 and PB21 connected to the third data line DL3, and a second green data signal applied to the pixels PG14 and PG24 connected to the fourth data line DL4.

Because pixels connected to the same data line are configured to emit light of the same color, the power consumption of the display apparatus may be reduced. The embodiments shown in FIGS. 5A and 5B are examples, and the connection of the pixels and the data lines according to the disclosure may be variously modified.

Figure 6:
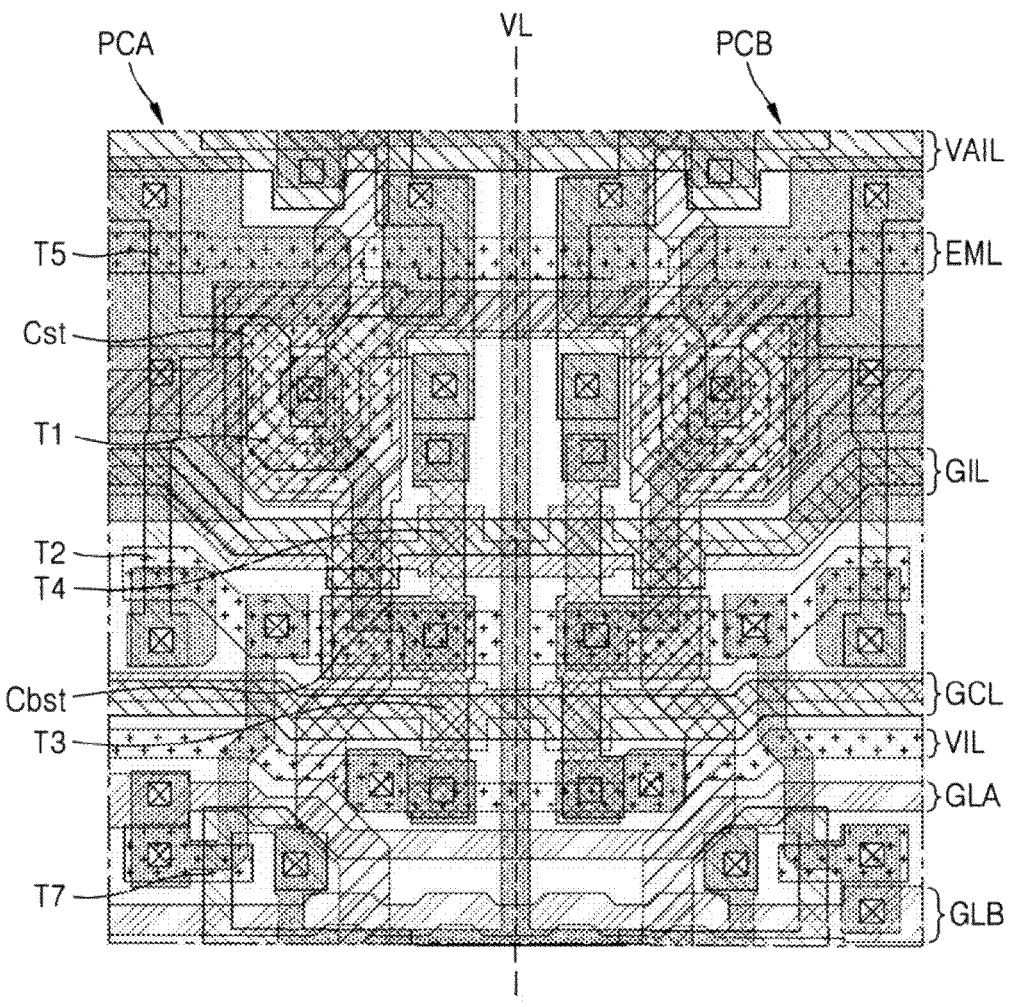
FIG. 6 is a schematic layout diagram of pixel circuits according to an embodiment.

FIG. 6 is a schematic layout diagram of pixel circuits according to an embodiment, and FIGS. 7 to 12 are schematic layout diagrams of pixel circuits for each layer according to an embodiment. In FIGS. 6 to 12, the first pixel circuit PCA and the second pixel circuit PCB adjacent to each other may have an approximately line-symmetrical structure with respect to the virtual line VL. Hereinafter, for convenience of description, the first pixel circuit PCA is mainly described. The description is substantially equally applicable to the second pixel circuit PCB. As used herein, the term "virtual line" is understood to mean a line that does not necessarily represent a physical feature of the device structure, but is rather a line defined thereon for the purpose of better describing the structure.

Referring to FIG. 6, the display apparatus may include the first pixel circuit PCA and the second pixel circuit PCB arranged in the same row and adjacent to each other. The first pixel circuit PCA and the second pixel circuit PCB may be arranged in the first direction (e.g., the x direction).

The first pixel circuit PCA and the second pixel circuit PCB may respectively correspond to the first pixel circuit PCA and the second pixel circuit PCB of FIG. 3. Each of the first pixel circuit PCA and the second pixel circuit PCB may include first to seventh transistors T1, T2, T3, T4, T5, T6, and T7, a storage capacitor $C_{st}$, and a boost capacitor $C_{bst}$.

The first pixel circuit PCA and the second pixel circuit PCB may be electrically connected to the second initialization voltage line VAIL, the emission control line EML, the third gate line GCL, and the fourth gate line GIL each extending primarily in the first direction (e.g., the x direction), and electrically connected to the driving voltage line PL (see FIG. 12) extending primarily in the second direction (e.g., the y direction).

Figure 12:
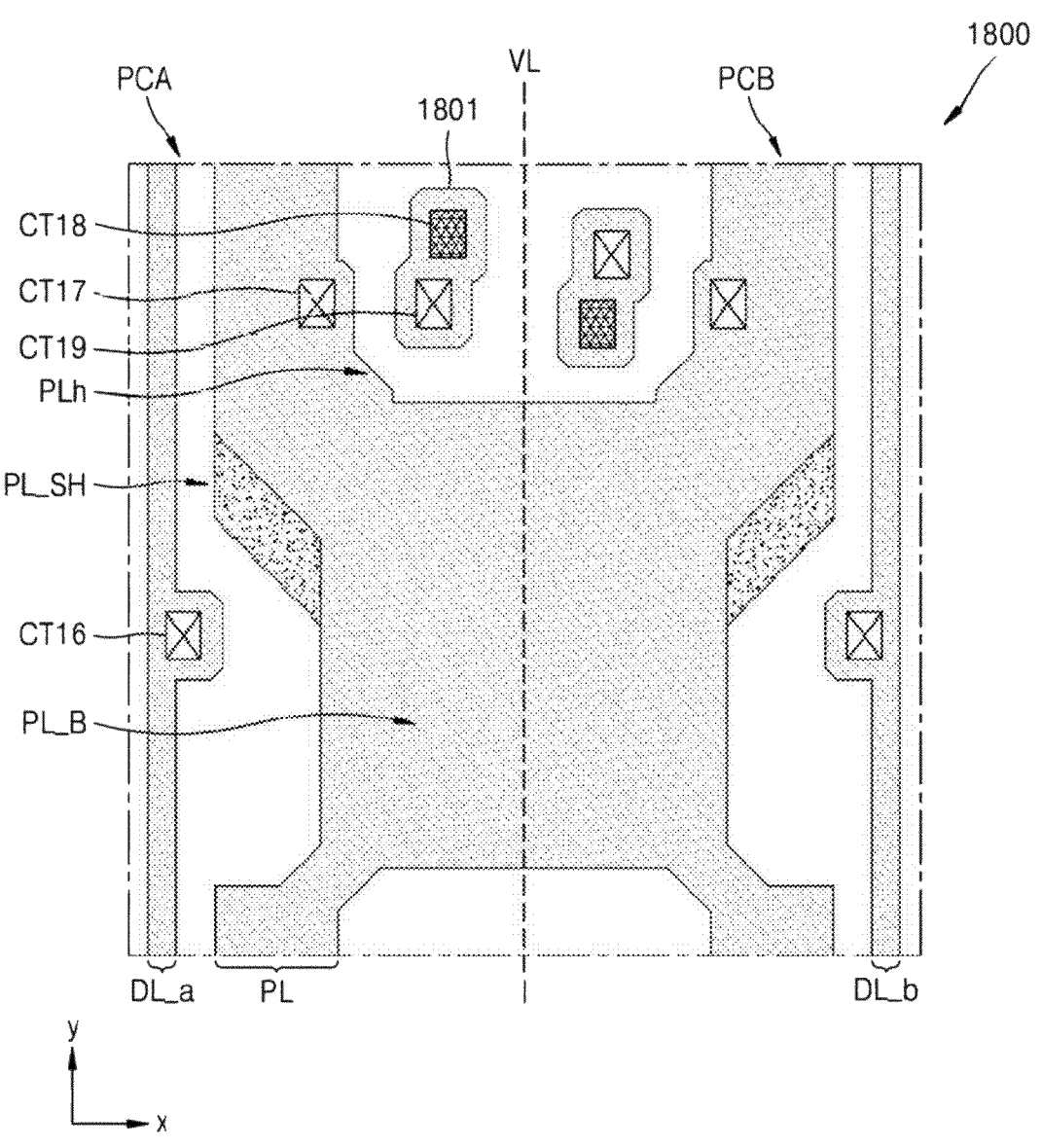

The first pixel circuit PCA may be electrically connected to the first gate line GLA and the first data line DL_a (see FIG. 12), and the second pixel circuit PCB may be electrically connected to the second gate line GLB and the second data line DL_b (see FIG. 12). The first gate line GLA and the second gate line GLB may extend primarily in the first direction (e.g., the x direction). The first data line DL_a and the second data line DL_b may extend primarily in the second direction (e.g., the y direction). The first data line DL_a and the second data line DL_b may be a pair of data lines connected to one output line through the demultiplexer DMX (see FIG. 2).

Figure 8:
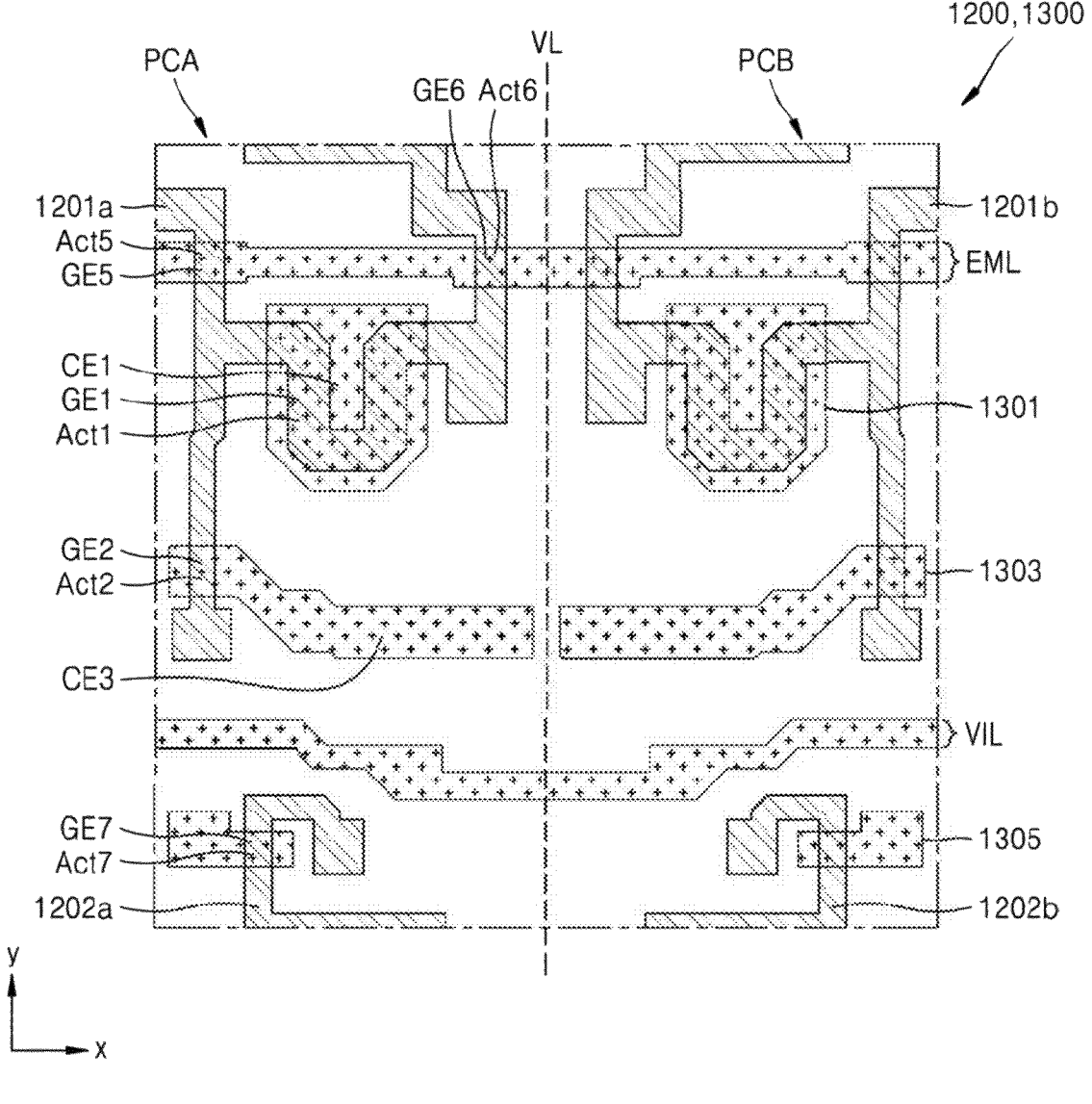

The first transistor T1, the second transistor T2, the fifth transistor T5, the sixth transistor T6, and the seventh transistor T7 of the first pixel circuit PCA may be arranged along a first semiconductor pattern 1201a (see FIG. 8). The third transistor T3 and the fourth transistor T4 of the first pixel circuit PCA may be arranged along a fifth semiconductor pattern 1501a (see FIG. 10). For convenience of description, the seventh transistor T7 shown in FIG. 6 represents the seventh transistor T7 of the third pixel circuit arranged in the next row of the first pixel circuit PCA. As an example, the first pixel circuit PCA is a pixel circuit arranged in an n-th row, the third pixel circuit may be a pixel circuit arranged in an (n+1)-th row. Because the first pixel circuit has the same shape as that of the third pixel circuit, description of the seventh transistor T7 of the third pixel circuit is equally applicable to the seventh transistor T7 of the first pixel circuit PCA.

In a plan view, the storage capacitor $C_{st}$ may overlap the first transistor T1. The storage capacitor $C_{st}$ may include a first capacitor electrode CE1 and a second capacitor electrode CE2 disposed on different layers.

In a plan view, the boost capacitor $C_{bst}$ may be disposed between the third transistor T3 and the fourth transistor T4. The boost capacitor $C_{bst}$ may include the third transistor T3 and the fourth transistor T4 disposed on different layers.

Hereinafter, the first pixel circuit PCA and the second pixel circuit PCB shown in FIG. 6 are described more specifically with reference to FIGS. 7 to 12.

Figure 7:
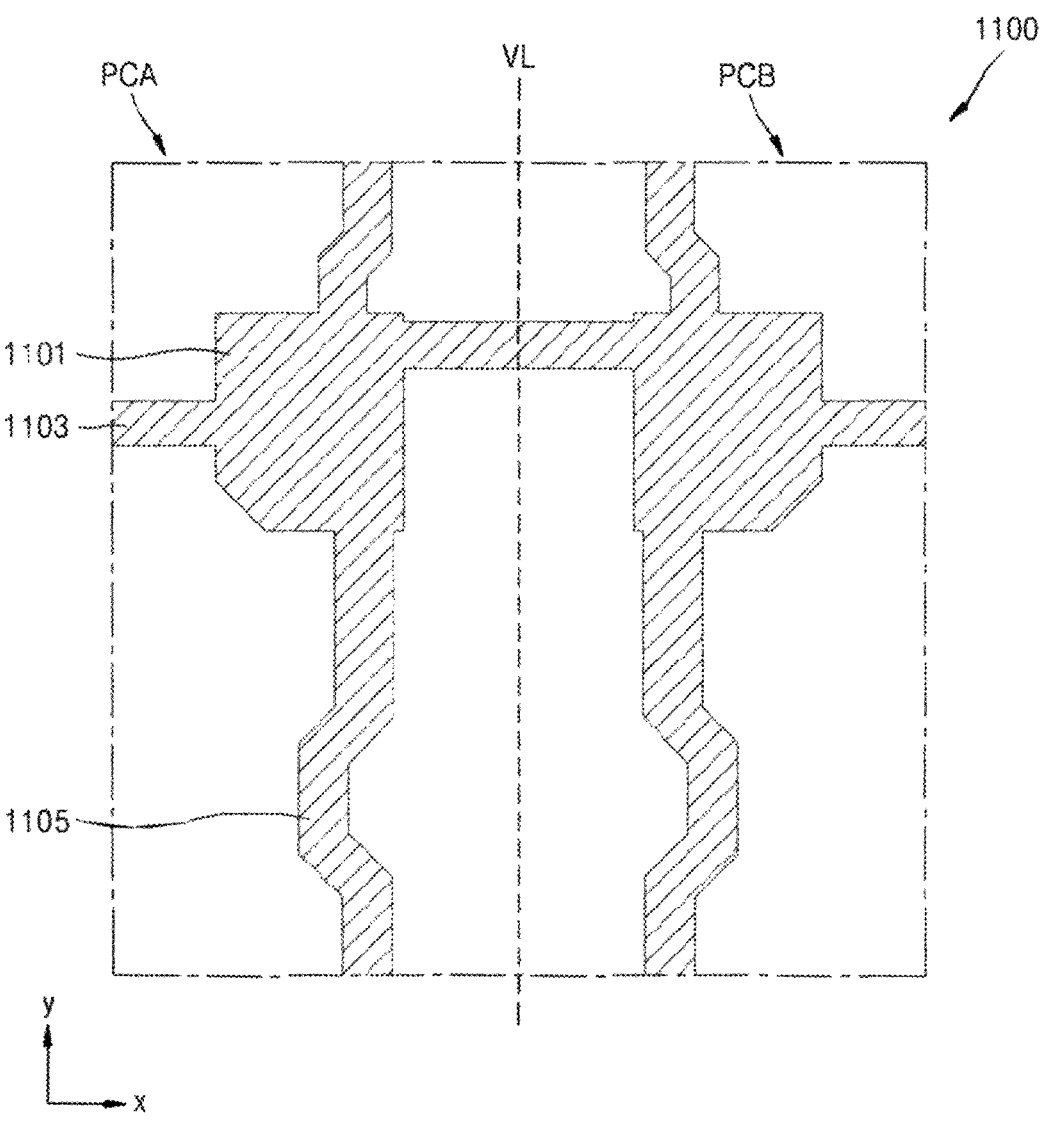
FIGS. 7 to 12 are schematic layout diagrams of pixel circuits for each layer according to an embodiment.

Referring to FIG. 7, a bottom metal layer 1100 may be disposed on a substrate. The bottom metal layer 1100 may include molybdenum (Mo), aluminum (Al), copper (Cu), titanium (Ti), and the like and include a single layer or a multi-layer. In an embodiment, the bottom metal layer 1100 may include a single Mo layer.

The bottom metal layer 1100 may include a first body 1101, a first line 1103, and a second line 1105, wherein body 1101 overlaps an active region Act1 of the first transistor T1, the first line 1103 extends in the first direction (e.g., the x direction) from the first body 1101, and the second line 1105 extends in the second direction (e.g., the y direction) from the first body 1101. The first body 1101 of the bottom metal layer 1100 may be electrically connected to first bodies of adjacent pixel circuits through the first line 1103 and the second line 1105.

Referring to FIG. 8, a first semiconductor layer 1200 may be disposed on the bottom metal layer 1100, and a first conductive layer 1300 may be disposed on the first semiconductor layer 1200. A first insulating layer (e.g., a buffer layer) may be disposed between the bottom metal layer 1100 and the first semiconductor layer 1200. A second insulating layer (e.g., a first gate insulating layer) may be disposed between the first semiconductor layer 1200 and the first conductive layer 1300. FIG. 8 shows the first semiconductor layer 1200 and the first conductive layer 1300 together.

The first semiconductor layer 1200 may be a silicon-based semiconductor layer including a silicon-based semiconductor material. The semiconductor layer 1200 may include a first semiconductor pattern 1201a, a second semiconductor pattern 1201b, a third semiconductor pattern 1202a, and a fourth semiconductor pattern 1202b.

The first semiconductor pattern 1201a may include the active region Act1 of the first transistor T1, an active region Act2 of the second transistor T2, an active region Act5 of the fifth transistor T5, an active region Act6 of the sixth transistor T6, and an active region of the seventh transistor T7. Doped regions may be respectively arranged on two opposite sides of each active region.

The second semiconductor pattern 1202b has a shape that is symmetrical with respect to the first semiconductor pattern 1201a about the virtual line VL and may be included in the second pixel circuit PCB. The third semiconductor pattern 1202a has the same shape as that of the first semiconductor pattern 1201a and may be included in the third pixel circuit arranged in the next row of the first pixel circuit PCA. An active region Act7 of the seventh transistor T7 included in the second semiconductor pattern 1201b shown in FIG. 8 may be included in the third pixel circuit. The fourth semiconductor pattern 1202b has the same shape as that of the second semiconductor pattern 1201b and may be included in the fourth pixel circuit arranged in the next row of the second pixel circuit PCB. As an example, when the first pixel circuit PCA and the second pixel circuit PCB are arranged in an n-th pixel circuit row, the third pixel circuit and the fourth pixel circuit may be arranged in an (n+1)-th pixel circuit row.

The active region Act1 of the first transistor T1 may have a curved shape in a plan view. Accordingly, the first transistor T1 may have a long channel length within a narrow space and be configured to control the grayscale (e.g., shade) of light emitted from the first light-emitting diode. The active region Act1 of the first transistor T1 may overlap the first body 1101 of the bottom metal layer 1100.

The first conductive layer 1300 may include a first conductive pattern 1301, a second conductive pattern 1303, a third conductive pattern 1305, the emission control line EML, and the first initialization voltage line VIL.

The first conductive layer 1300 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and include a single layer or a multi-layer including the above materials.

The first conductive pattern 1301, the second conductive pattern 1303, and the third conductive pattern 1305 may each have an island shape that is isolated in a plan view.

The first conductive layer 1301 may include a gate electrode GE1 of the first transistor T1 overlapping the active region Act1 of the first transistor T1. The first conductive pattern 1301 may include the first capacitor electrode CE1 of the storage capacitor $C_{st}$. For example, the gate electrode GE1 of the first transistor T1 may be integrally provided with the first capacitor electrode CE1 of the storage capacitor $C_{st}$, for example, they may be part of a single continuous structure.

The second conductive pattern 1303 may include a gate electrode GE2 of the second transistor T2 overlapping the active region Act2 of the second transistor T2. The second conductive pattern 1303 may include the third capacitor electrode CE3 of the boost capacitor $C_{bst}$. For example, the gate electrode GE2 of the second transistor T2 may be integrally provided with the third capacitor electrode CE3 of the boost capacitor $C_{bst}$, for example, they may be part of a single continuous structure.

The third conductive pattern 1305 may include a gate electrode GE7 of the seventh transistor T7 overlapping the active region Act7 of the seventh transistor T7.

The emission control line EML and the first initialization voltage line VIL may extend primarily in the first direction (e.g., the x direction). The first initialization voltage line VIL may be configured to transfer the first initialization voltage $V_{INT}$ (see FIG. 3) to the fourth transistor T4.

The emission control line EML may include a gate electrode GE5 of the fifth transistor T5 overlapping the active region Act5 of the fifth transistor T5, and a gate electrode GE6 of the sixth transistor T6 overlapping the active region Act6 of the sixth transistor T6. The emission control line EML may be configured to transfer an emission control signal EM (see FIG. 3) to the fifth transistor T5 and the sixth transistor T6.

Figure 9:
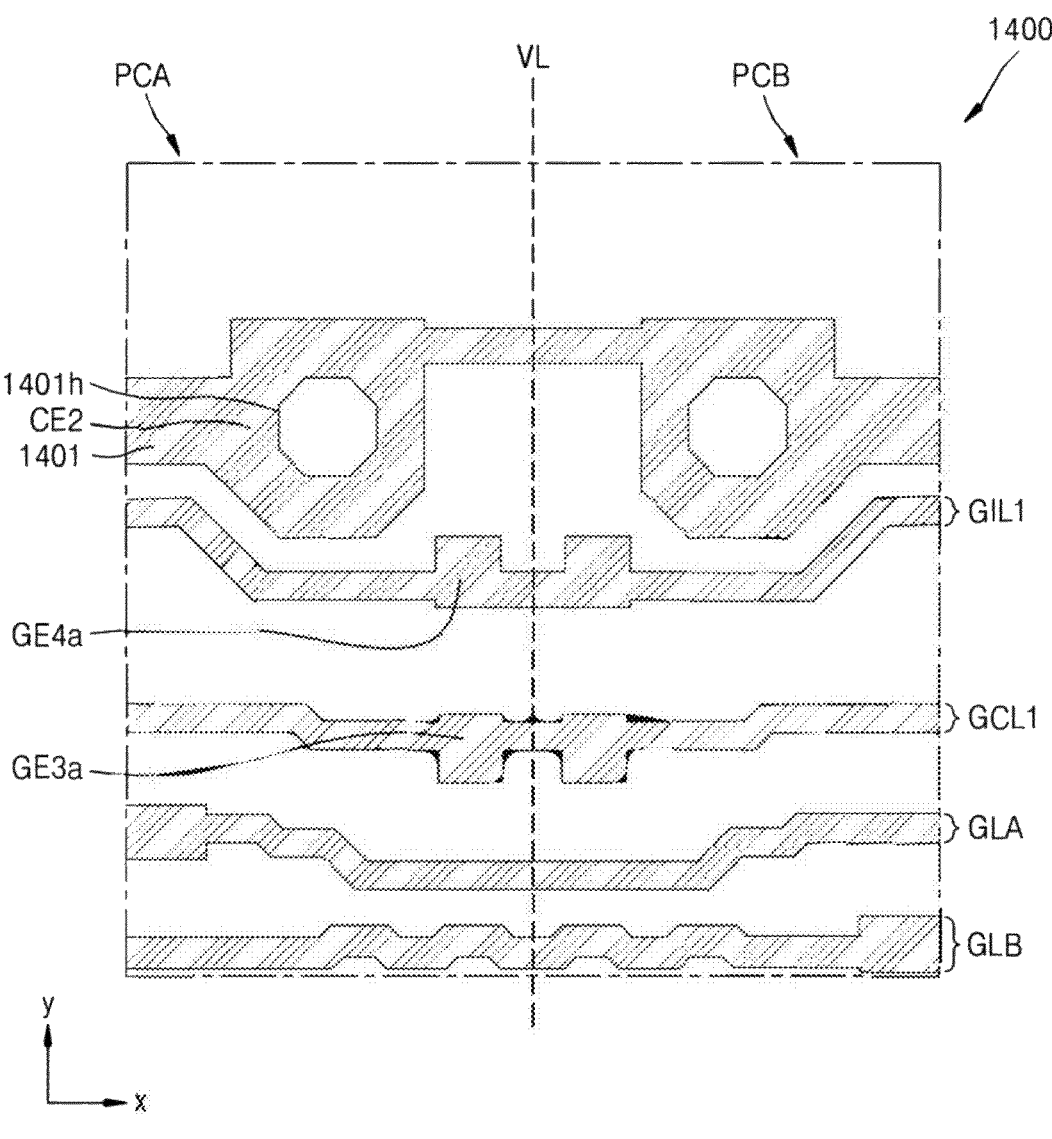

Referring to FIG. 9, the second conductive layer 1400 may be disposed on the first conductive layer 1300. A third insulating layer (e.g., a second gate insulating layer) may be disposed between the first conductive layer 1300 and the second conductive layer 1400.

The second conductive layer 1400 may include a fourth conductive pattern 1401, a first sub-gate line GIL1, a second sub-gate line GCL1, the first gate line GLA, and the second gate line GLB.

The second conductive layer 1400 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and include a single layer or a multi-layer including the above materials.

The fourth conductive pattern 1401 may include the second capacitor electrode CE2 overlapping the first capacitor electrode CE1. The first capacitor electrode CE1 and the second capacitor electrode CE2 may constitute the storage capacitor $C_{st}$. The fourth conductive pattern 1401 may be configured to define a first hole 1401h exposing the upper surface of the third insulating layer. The fourth conductive pattern 1401 may extend primarily in the first direction (e.g., the x direction) and be connected to the fourth conductive pattern of adjacent pixel circuits.

The first sub-gate line GIL1, the second sub-gate line GCL1, the first gate line GLA, and the second gate line GLB may extend primarily in the first direction (e.g., the x direction).

The first sub-gate line GIL1 may be a lower gate line of the fourth gate line GIL. The first sub-gate line GIL1 may include a lower gate electrode GE4a of the fourth transistor T4 overlapping the active region Act4 of the fourth transistor T4. The first sub-gate line GIL1 may be configured to transfer a fourth gate signal GI (see FIG. 3) to the fourth transistor T4.

The second sub-gate line GCL1 may be a lower gate line of the third gate line GCL. The second sub-gate line GCL1 may include a lower gate electrode GE3a of the third transistor T3 overlapping the active region Act3 of the third transistor T3. The second sub-gate line GCL1 may be configured to transfer a third gate signal GC (see FIG. 3) to the third transistor T3.

The first gate line GLA may be configured to transfer a first gate signal GWA (see FIG. 3) to the second transistor T2 of the first pixel circuit PCA and the seventh transistor T7 of the third pixel circuit. The second gate line GLB may be configured to transfer a second gate signal GWB (see FIG. 3) to the second transistor T2 of the second pixel circuit PCB and the seventh transistor T7 of the fourth pixel circuit. The fourth pixel circuit is a pixel circuit arranged in the next row of the second pixel circuit PCB and may have the same shape as that of the second pixel circuit PCB.

The second gate line GLB may have a zigzag shape in a plan view. Because the second gate line GLB has a sufficient length even in a narrow region due to a serpentine shape, the first gate line GLA and the second gate line GLB may have substantially the same resistance.

Accordingly, a deviation in brightness between the first pixel connected to the first gate line GLA and the second pixel connected to the second gate line GLB may be reduced.

Figure 10:
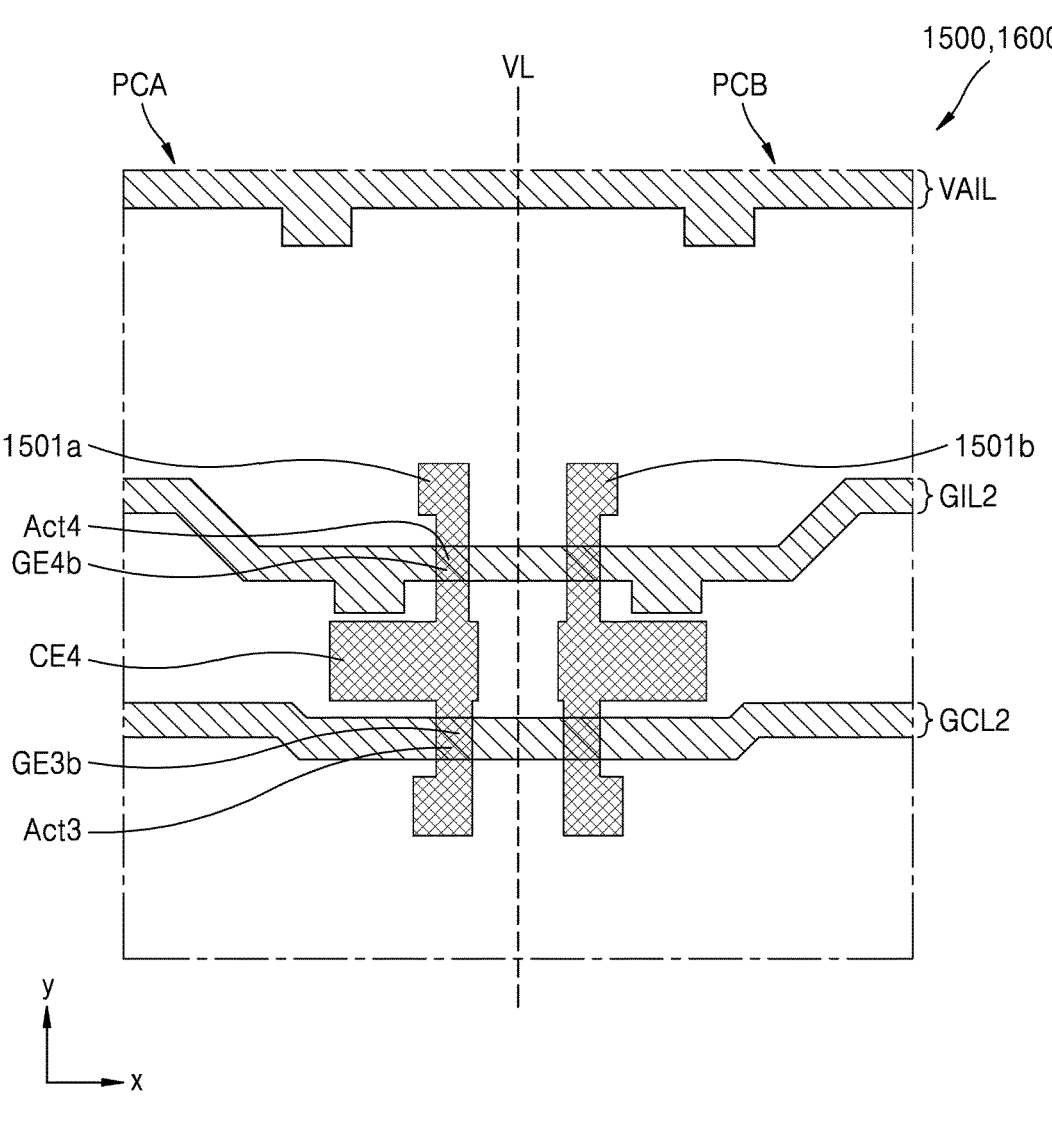

Referring to FIG. 10, a second semiconductor layer 1500 may be disposed on the second conductive layer 1400, and a third conductive layer 1600 may be disposed on the second semiconductor layer 1500. A fourth insulating layer (e.g., a third gate insulating layer) may be disposed between the second conductive layer 1400 and the second semiconductor layer 1500, and a fifth insulating layer (e.g., the fourth gate insulating layer) may be disposed between the second semiconductor layer 1500 and the third conductive layer 1600. FIG. 10 shows the second semiconductor layer 1400 and the second conductive layer 1500 together.

The second semiconductor layer 1500 may be an oxide-based semiconductor layer including an oxide-based semiconductor material. The oxide-based semiconductor material may include an oxide of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and/or zinc (Zn).

Because the oxide semiconductor material has a wide band gap and a low leakage current, a voltage drop is not large even though a driving time of a transistor is long, and thus, a change in the brightness corresponding to the voltage drop is not large even when the display apparatus is driven at low frequencies.

The second semiconductor layer 1500 may include a fifth semiconductor pattern 1501a and a sixth semiconductor pattern 1501b. The fifth semiconductor pattern 1501a may include the active region Act3 of the third transistor T3 and the active region Act4 of the fourth transistor T4 of the first pixel circuit PCA. Doped regions may be respectively arranged on two opposite sides of each active region. The fifth semiconductor pattern 1501a may include the fourth capacitor electrode CE4 disposed between the active region Act3 of the third transistor T3 and the active region Act4 of the fourth transistor T4. The fourth capacitor electrode CE4 may overlap the third capacitor electrode CE3 to form the boost capacitor $C_{bst}$.

The fifth semiconductor pattern 1501*a* and the sixth semiconductor pattern 1501*b* may have shapes that are symmetrical with respect to each other about the virtual line VL.

The third conductive layer 1600 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and include a single layer or a multi-layer including the above materials.

The third conductive layer 1600 may include the second initialization voltage line VAIL, the third sub-gate line GIL2, and the fourth sub-gate line GCL2 each extending primarily in the first direction (e.g., the x direction).

The second initialization voltage line VAIL may be configured to transfer the second initialization voltage $V_{AINT}$ (see FIG. 3) to the seventh transistor T7.

The third sub-gate line GIL2 may be an upper gate line of the fourth gate line GIL. The third sub-gate line GIL2 may include an upper gate electrode GE4*b* of the fourth transistor T4 overlapping the active region Act4 of the fourth transistor T4. The upper gate electrode GE4*b* of the fourth transistor T4 may overlap the lower gate electrode GE4*a* of the fourth transistor T4. Accordingly, the fourth transistor T4 may have a double gate electrode structure. The third sub-gate line GIL2 may be configured to transfer a fourth gate signal GI (see FIG. 3) to the fourth transistor T4.

The fourth sub-gate line GCL2 may be an upper gate line of the third gate line GCL. The fourth sub-gate line GCL2 may include an upper gate electrode GE3*b* of the third transistor T3 overlapping the active region Act3 of the third transistor T3. The upper gate electrode GE3*b* of the third transistor T3 may overlap the lower gate electrode GE3*a* of the third transistor T3. Accordingly, the third transistor T3 may have a double gate electrode structure.

Figure 11:
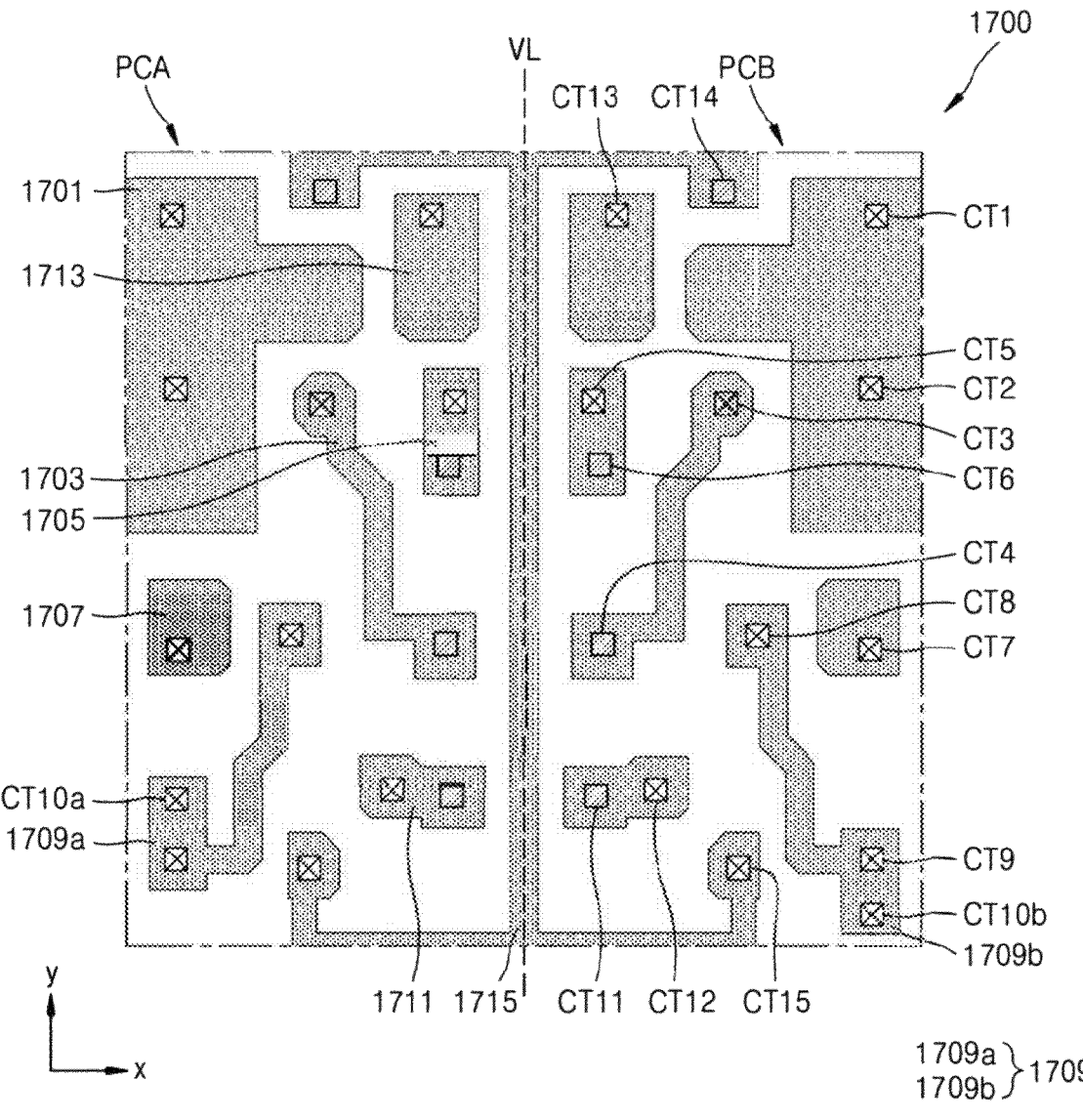

Referring to FIG. 11, a fourth conductive layer 1700 may be disposed on the third conductive layer 1600. A sixth insulating layer (e.g., an interlayer insulating layer) may be disposed between the third conductive layer 1600 and the fourth conductive layer 1700. The fourth conductive layer 1700 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and include a single layer or a multi-layer including the above materials.

The fourth conductive layer 1700 may include a fifth conductive pattern 1701, a sixth conductive pattern 1703, a seventh conductive pattern 1705, an eighth conductive pattern 1707, a ninth conductive pattern 1709, a tenth conductive pattern 1711, an eleventh conductive pattern 1713, and a twelfth conductive pattern 1715.

The fifth conductive pattern 1701, the sixth conductive pattern 1703, the seventh conductive pattern 1705, the eighth conductive pattern 1707, the tenth conductive pattern 1711, the eleventh conductive pattern 1713, and the twelfth conductive pattern 1715 of the first pixel circuit PCA may have a symmetrical shape to corresponding patterns of the second pixel circuit PCB with respect to the virtual line VL. For convenience of description, the first pixel circuit PCA is mainly described. The description is equally applicable to the second pixel circuit PCB.

The fifth conductive pattern 1701 may be electrically connected to the first semiconductor pattern 1201*a* of the first semiconductor layer 1200 through a first contact hole CT1 and electrically connected to the fourth conductive pattern 1401 of the second conductive layer 1400 through a second contact hole CT2. The fifth conductive pattern 1701 may electrically connect the driving voltage line PL, the first terminal of the fifth transistor T4, and the second capacitor electrode CE2 of the storage capacitor $C_{st}$.

The sixth conductive pattern 1703 may be electrically connected to the first conductive pattern 1301 of the first conductive layer 1300 through a third contact hole CT3 and electrically connected to the fifth semiconductor pattern 1501*a* of the second semiconductor layer 1500 through a fourth contact hole CT4. The third contact hole CT3 may overlap the first hole 1401*h* defined by the fourth conductive pattern 1401. The sixth conductive pattern 1703 may electrically connect the gate electrode GE1 of the first transistor T1, the first capacitor electrode CE1 of the storage capacitor $C_{st}$, the first terminal of the third transistor T3, and the second terminal of the fourth transistor T4.

The seventh conductive pattern 1705 may be electrically connected to the first semiconductor pattern 1201*a* of the first semiconductor layer 1200 through a fifth contact hole CT5 and electrically connected to the fifth semiconductor pattern 1501*a* of the second semiconductor layer 1500 through a sixth contact hole CT6. The seventh conductive pattern 1705 may electrically connect the second terminal of the first transistor T1 and the second terminal of the third transistor T3.

The eighth conductive pattern 1707 may be electrically connected to the first semiconductor pattern 1201*a* of the first semiconductor layer 1200 through a seventh contact hole CT7. The eighth conductive pattern 1707 may electrically connect the first data line DL_a to the first terminal of the second transistor T2.

The ninth conductive pattern 1709 may include a ninth-1 conductive pattern 1709*a* included in the first pixel circuit PCA and a ninth-2 conductive pattern 1709*b* included in the second pixel circuit PCB. Unlike other conductive patterns having symmetrical shapes in the first pixel circuit PCA and the second pixel circuit PCB with respect to the virtual line VL, the ninth-1 conductive pattern 1709*a* and the ninth-2 conductive pattern 1709*b* may have different shapes.

In the first pixel circuit PCA, the ninth-1 conductive pattern 1709*a* may be electrically connected to the second conductive pattern 1303 of the first conductive layer 1300 through an eighth contact hole CT8, electrically connected to the third conductive pattern 1305 through a ninth contact hole CT9, and electrically connected to the first gate line GLA through a tenth-H contact hole CT10a. The ninth-1 conductive pattern 1709*a* may be a first branch electrode electrically connecting the first gate line GLA, the gate electrode GE2 of the second transistor T2 of the first pixel circuit PCA, and the gate electrode GE7 of the seventh transistor T7 of the third pixel circuit.

In the second pixel circuit PCB, the ninth-2 conductive pattern 1709*b* may be electrically connected to the second conductive pattern 1303 of the first conductive layer 1300 through the eighth contact hole CT8, electrically connected to the third conductive pattern 1305 through the ninth contact hole CT9, and electrically connected to the second gate line GLB through a tenth-2 contact hole CT10*b*. The ninth-2 conductive pattern 1709*b* may be a second branch electrode electrically connecting the second gate line GLB, the gate electrode GE2 of the second transistor T2 of the second pixel circuit PCB, and the gate electrode GE7 of the seventh transistor T7 of the fourth pixel circuit.

Because the ninth-1 conductive pattern 1709*a* and the ninth-2 conductive pattern 1709*b* are provided, a difference between the shape of the first pixel circuit PCA and the shape of the second pixel circuit PCB may be reduced. Accordingly, a deviation in brightness between the first pixel connected to the first pixel circuit PCA and the second pixel connected to the second pixel circuit PCB may be reduced.

The tenth conductive pattern 1711 may be electrically connected to the fifth semiconductor pattern 1501*a* of the second semiconductor layer 1500 through an eleventh contact hole CT11 and be electrically connected to the first initialization voltage line VIL of the first conductive layer 1300 through a twelfth contact hole CT12. The tenth conductive pattern 1711 may electrically connect the first initialization voltage line VIL to the first terminal of the fourth transistor T4.

The eleventh conductive pattern 1713 may be electrically connected to the first semiconductor pattern 1201*a* of the first semiconductor layer 1200 through a thirteenth contact hole CT13. The eleventh conductive pattern 1713 may be a first connection electrode electrically connecting the second terminal of the sixth transistor T6 to the pixel electrode of the first light-emitting diode.

The twelfth conductive pattern 1715 may be electrically connected to the second initialization voltage line VAIL through a fourteenth contact hole CT14 and be electrically connected to the third semiconductor pattern 1202*a* of the first semiconductor layer 1200 through a fifteenth contact hole CT15. The twelfth conductive pattern 1715 may electrically connect the second terminal of the seventh transistor T7 to the second initialization voltage line VAIL.

A portion of the twelfth conductive pattern 1715 may extend primarily in the second direction (e.g., the y direction) along the virtual line VL located on the boundary between the first pixel circuit PCA and the second pixel circuit PCB. The second initialization voltage line VAIL extending primarily in the first direction (e.g., the x direction) and the twelfth conductive pattern 1715 having a portion extending primarily in the second direction (e.g., the y direction) may form a mesh structure in the display area.

Referring to FIG. 12, a fifth conductive layer 1800 may be disposed on the fourth conductive layer 1700. A seventh insulating layer (e.g., a first planarization layer) may be disposed between the fourth conductive layer 1700 and the fifth conductive layer 1800. The fifth conductive layer 1800 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), and include a single layer or a multi-layer including the above materials.

The fifth conductive layer 1800 may include a thirteenth conductive pattern 1801, the first data line DL_a, the second data line DL_b, and the driving voltage line PL.

The thirteenth conductive pattern 1801 may be electrically connected to the pixel electrode of the first light-emitting diode through an eighteenth contact hole CT18 and be electrically connected to the eleventh conductive pattern 1713 of the fourth conductive layer 1700 through a nineteenth contact hole CT19. The thirteenth conductive pattern 1801 may be a second connection electrode electrically connecting the second terminal of the sixth transistor T6 to the pixel electrode of the first light-emitting diode.

The first data line DL_a, the second data line DL_b, and the driving voltage line PL may extend primarily in the second direction (e.g., the y direction). The first data line DL_a may overlap the first pixel circuit PCA, and the second data line DL_b may overlap the second pixel circuit PCB. The driving voltage line PL may overlap the first pixel circuit PCA and the second pixel circuit PCB and may have a symmetrical shape with respect to the virtual line VL located on the boundary between the first pixel circuit PCA and the second pixel circuit PCB.

The first data line DL_a may be electrically connected to the eighth conductive pattern 1707 through a sixteenth contact hole CT16 and be configured to transfer a first data signal to the first terminal of the second transistor T2 of the first pixel circuit PCA. The second data line DL_b may be configured to transfer a second data signal to the first terminal of the second transistor T2 of the second pixel circuit PCB. The first data line DL_a and the second data line DL_b may be a pair of data lines connected to one corresponding output line through the demultiplexer.

The driving voltage line PL may be electrically connected to the fifth conductive pattern 1701 through a seventeenth contact hole CT17. The driving voltage line PL may be configured to transfer the first power voltage to the first terminal of the fifth transistor T5 and the second capacitor electrode CE2 of the storage capacitor $C_{st}$.

The driving voltage line PL may include a second body PL_B overlapping the active region Act1 of the first transistor T1, the active region Act3 of the third transistor T3, and the active region Act4 of the fourth transistor T4. In an embodiment, the pixel electrode may overlap the second body PL_B of the driving voltage line PL. The second body PL_B of the driving voltage line PL may reduce interferences due to the pixel electrode by shielding the first transistor T1, the third transistor T3, and the fourth transistor T4.

The driving voltage line PL may define a second hole PLh. In a plan view, the thirteenth conductive patterns 1801 may be arranged inside the second hole PLh.

In an embodiment, the driving voltage line PL may include a shield PL_SH. The shield PL_SH may extend from the second body PL_B and overlap a dummy portion or a connector of the pixel electrodes described below. The shield PL_SH of the driving voltage line PL may be configured to reduce a deviation in brightness between the first pixel and the second pixel by reducing a deviation in a parasitic capacitance between the pixel electrodes.

Figure 13A:
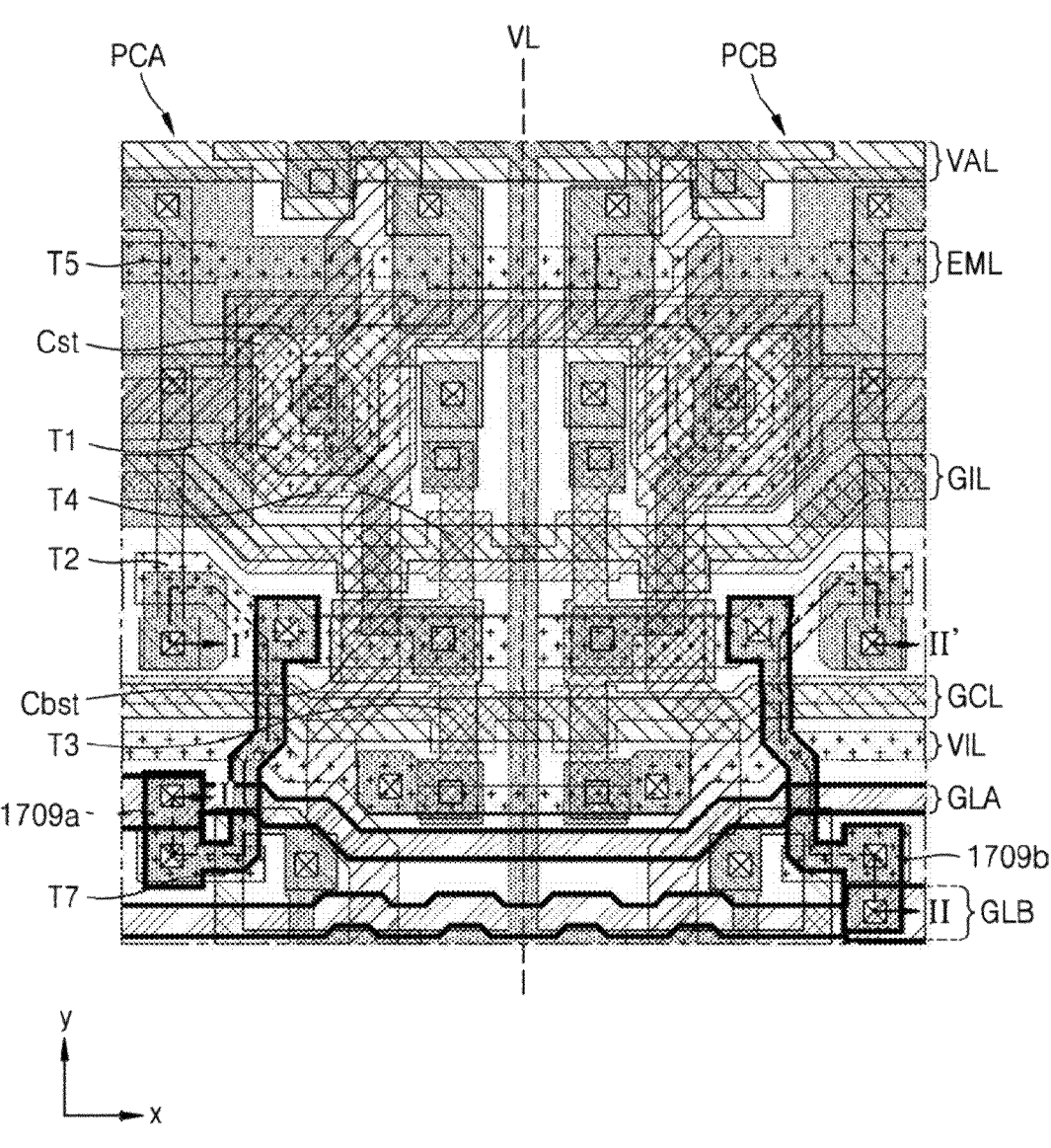
FIG. 13A is a view illustrating branch lines and gate lines according to an embodiment.
Figure 13B:
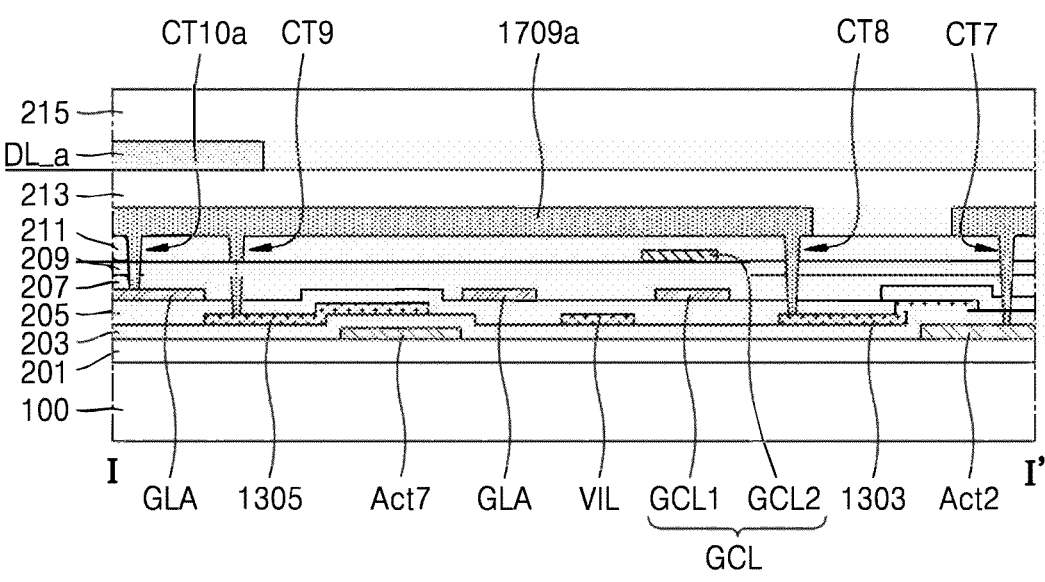
FIGS. 13B and 13C are schematic cross-sectional views of a display apparatus according to an embodiment.
Figure 13C:
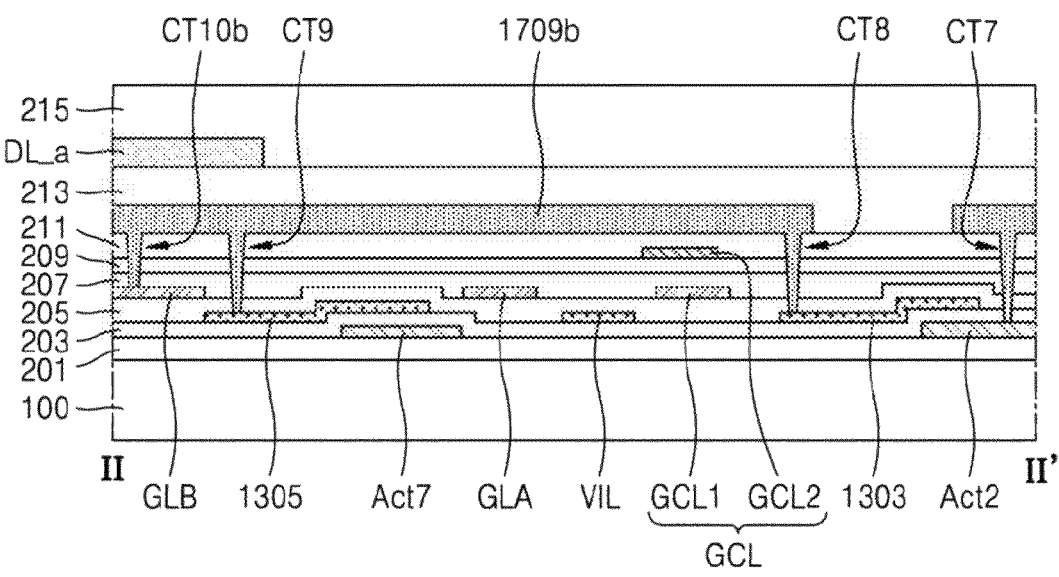

FIG. 13A is a view illustrating branch lines and gate lines according to an embodiment, and FIGS. 13B and 13C are schematic cross-sectional views of a display apparatus according to an embodiment.

Referring to FIG. 13A, the first pixel circuit PCA may include the ninth-1 conductive pattern 1709*a* (e.g., the first branch electrode) electrically connected to the first gate line GLA and include the ninth-2 conductive pattern 1709*b* (e.g., the second branch electrode) electrically connected to the second gate line GLB.

The first gate line GLA and the second gate line GLB may extend primarily in the first direction (e.g., the x direction) and be spaced apart from each other in the second direction (e.g., the y direction). The second gate line GLB may have a zigzag shape in a plan view. Because the second gate line GLB has a zigzag shape, the first gate line GLA and the second gate line GLB may have substantially the same resistance.

In a plan view, the third gate line GCL and the first initialization voltage line VIL may be disposed between the second transistor T2 and the first gate line GLA. The ninth-1 conductive pattern 1709*a* and the ninth-2 conductive pattern 1709*b* may cross the third gate line GCL and the first initialization voltage line VIL. The seventh transistors T7 may be disposed between the first gate line GLA and the second gate line GLB.

The ninth-1 conductive pattern 1709a may be electrically connected to the second conductive pattern 1303 and the third conductive pattern 1305 of the first pixel circuit PCA, and the ninth-2 conductive pattern 1709b may be electrically connected to the second conductive pattern 1303 and the third conductive pattern 1305 of the second pixel circuit PCB. The second conductive pattern 1303 may include the gate electrode GE2 (see FIG. 8) of the second transistor T2, and the third conductive pattern 1305 may include the gate electrode GE7 (see FIG. 8) of the seventh transistor T7.

Referring to FIGS. 13B and 13C, the display apparatus may include a substrate 100. The substrate 100 may include glass, a ceramic material, or a metal. The substrate 100 may include a flexible or bendable material. In the case where the substrate 100 is flexible or bendable, the substrate 100 may include a polymer resin including polyethersulfone, polyacrylate, polyetherimide, polyethylene naphthalate, polyethylene terephthalate, polyphenylene sulfide, polyarylate, polyimide, polycarbonate, and/or cellulose acetate propionate.

The substrate 100 may have a single-layered structure or a multi-layered structure of the above materials, and may further include an inorganic layer disposed between organic layers including polymer resin in the case of the multi-layered structure.

A first insulating layer 201 may be disposed on the substrate 100. The first insulating layer 201 may be configured to prevent impurity ions from diffusing from the substrate 100 to the first semiconductor layer 1200 (see FIG. 8) and may provide a flat upper surface. The bottom metal layer 1100 (see FIG. 7) may be disposed between the substrate 100 and the first insulating layer 201. The first insulating layer 201 may include an inorganic insulating material such as silicon oxide, silicon nitride and/or silicon oxynitride.

The first semiconductor layer 1200 (see FIG. 8) may be disposed on the first insulating layer 201. The first semiconductor layer 1200 may be a silicon semiconductor layer including a silicon semiconductor material. The first semiconductor layer 1200 may include the active region Act2 of the second transistor T2 and the active region Act7 of the seventh transistor T7.

A second insulating layer 203 may be disposed on the first semiconductor layer 1200. The second insulating layer 203 may include an inorganic insulating material such as silicon oxide, silicon nitride and/or silicon oxynitride.

The first conductive layer 1300 (see FIG. 8) may be disposed on the second insulating layer 203. The first conductive layer 1300 may include the second conductive pattern 1303, the third conductive pattern 1305, and the first initialization voltage line VIL. The second conductive pattern 1303 may overlap the active region Act2 of the second transistor T2, and the third conductive pattern 1305 may overlap the active region Act7 of the seventh transistor T7. The second conductive pattern 1303 may include the gate electrode of the second transistor T2, and the third conductive pattern 1305 may include the gate electrode of the seventh transistor T7.

The first initialization voltage line VIL may be a wiring configured to transfer the first initialization voltage $V_{INT}$ (see FIG. 3) to the first pixel circuit PCA and the second pixel circuit PCB.

A third insulating layer 205 may be disposed on the first conductive layer 1300 (see FIG. 8). The third insulating layer 205 may include an inorganic insulating material such as silicon oxide, silicon nitride and/or silicon oxynitride.

The second conductive layer 1400 (see FIG. 9) may be disposed on the third insulating layer 205. The second conductive layer 1400 may include the first gate line GLA, the second gate line GLB, and the second sub-gate line GCL1. The first gate line GLA may be configured to transfer a first gate signal GWA (see FIG. 3) to the first pixel circuit PCA, and the second gate line GLB may be configured to transfer a second gate signal GWB (see FIG. 3) to the second pixel circuit PCB. The second sub-gate line GCL1 may be a wiring configured to transfer a third gate signal GC (see FIG. 3) to the first pixel circuit PCA and the second pixel circuit PCB.

A fourth insulating layer 207 and a fifth insulating layer 209 may be disposed on the second conductive layer 1400 (see FIG. 9). The fourth insulating layer 207 and the fifth insulating layer 209 may include an inorganic insulating material such as silicon oxide, silicon nitride and/or silicon oxynitride. The second semiconductor layer 1500 (see FIG. 10) may be disposed between the fourth insulating layer 207 and the fifth insulating layer 209.

The third conductive layer 1600 (see FIG. 10) may be disposed on the fifth insulating layer 209. The third conductive layer 1600 may include the fourth sub-gate line GCL2. The fourth sub-gate line GCL2 may be a wiring configured to transfer a third gate signal GC (see FIG. 3) to the first pixel circuit PCA and the second pixel circuit PCB. The second sub-gate line GCL1 and the fourth sub-gate line GCL2 are arranged to overlap each other and may form the third gate line GCL configured to transfer a third gate signal GC (see FIG. 3) to the third transistor T3.

A sixth insulating layer 211 may be disposed on the third conductive layer 1600 (see FIG. 10). The sixth insulating layer 211 may include an inorganic insulating material or an organic insulating material. The inorganic insulating material may include silicon oxide, silicon nitride, and/or silicon oxynitride. The organic insulating material may include an acryl-based resin, an epoxy-based resin, polyimide, and polyethylene.

The fourth conductive layer 1700 (see FIG. 11) may be disposed on the sixth insulating layer 211. The fourth conductive layer 1700 may include the ninth-1 conductive pattern 1709a and the ninth-2 conductive pattern 1709b.

The ninth-1 conductive pattern 1709a may be electrically connected to the second conductive pattern 1303 through the eighth contact hole CT8, electrically connected to the third conductive pattern 1305 through the ninth contact hole CT9, and electrically connected to the first gate line GLA through the tenth-H contact hole CT10a. The ninth-1 conductive pattern 1709a may be the first branch electrode electrically connecting the first gate line GLA, the gate electrode GE2 (see FIG. 8) of the second transistor T2 of the first pixel circuit PCA, and the gate electrode GE7 (see FIG. 8) of the seventh transistor T7 of the third pixel circuit.

The ninth-2 conductive pattern 1709b may be electrically connected to the second conductive pattern 1303 through the eighth contact hole CT8, electrically connected to the third conductive pattern 1305 through the ninth contact hole CT9, and electrically connected to the second gate line GLB through the tenth-2 contact hole CT10b. The ninth-2 conductive pattern 1709b may be the second branch electrode electrically connecting the first gate line GLA, the gate electrode GE2 (see FIG. 8) of the second transistor T2 of the second pixel circuit PCB, and the gate electrode GE7 (see FIG. 8) of the seventh transistor T7 of the fourth pixel circuit.

A seventh insulating layer 213 may be disposed on the fourth conductive layer 1700 (see FIG. 11). The seventh insulating layer 213 may include an organic insulating material such as an acrylic-based resin, an epoxy-based resin, polyimide, and/or polyethylene.

The fifth conductive layer 1800 (see FIG. 12) may be disposed on the seventh insulating layer 213. The fifth conductive layer 1800 may include the first data line DL_a and the second data line DL_b. The first data line DL_a may be configured to transfer a first data signal to the first pixel circuit PCA, and the second data line DL_b may be configured to transfer a second data signal to the second pixel circuit PCB.

An eighth insulating layer 215 may be disposed on the fifth conductive layer 1800 (see FIG. 12). The eighth insulating layer 215 may include an organic insulating material such as an acryl-based resin, an epoxy-based resin, polyimide, and polyethylene. Light-emitting diodes may be disposed on the eighth insulating layer 215. Each light-emitting diode may include a pixel electrode, an opposite electrode, and an emission layer between the pixel electrode and the opposite electrode.

Because the first pixel circuit PCA receives a first gate signal GWA (see FIG. 2) synchronized with a first control signal CLA (see FIG. 2) through the first gate line GLA, and the second pixel circuit PCB receives a second gate signal GWB synchronized with a second control signal CLB (see FIG. 2) through the second gate line GLB, data may be written to the first pixel circuit PCA and the second pixel circuit PCB for the same line time LT (see FIG. 4B).

Each of the first pixel circuit PCA and the second pixel circuit PCB includes the ninth-1 conductive pattern 1709_a_ and the ninth-2 conductive pattern 1709_b_ to reduce a difference in electrical characteristics between the corresponding elements. In addition, because the first gate line GLA and the second gate line GLB have substantially the same resistance, a deviation in brightness between the first light-emitting diode electrically connected to the first pixel circuit PCA and the second light-emitting diode electrically connected to the second pixel circuit PCB may be reduced.

Figure 14:
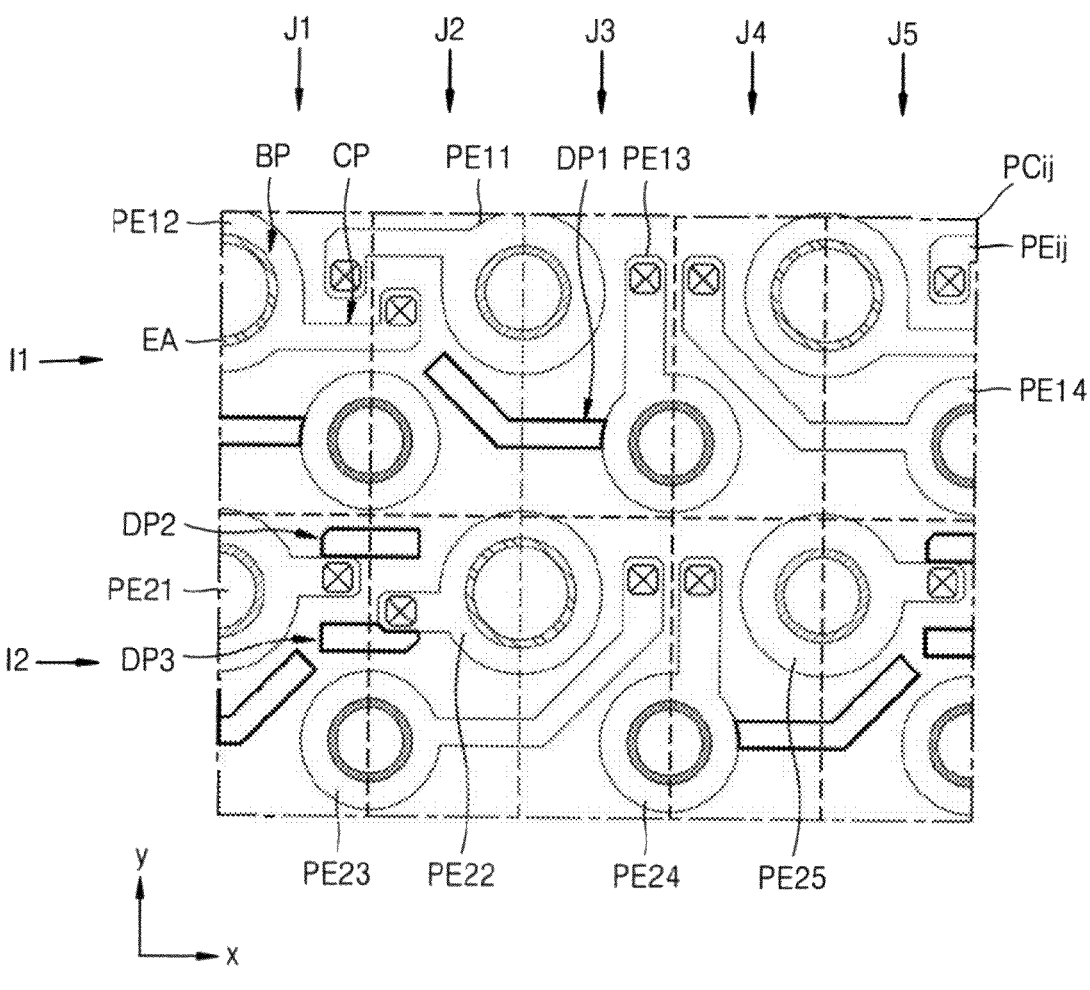
FIG. 14 is a schematic layout diagram of pixel electrodes according to an embodiment.

FIG. 14 is a schematic layout diagram of pixel electrodes according to an embodiment.

Referring to FIG. 14, the display apparatus may include a plurality of pixel circuits PCij arranged in the first direction (e.g., the x direction) and the second direction (e.g., the y direction) and forming a matrix. Like the above-described first pixel circuit PCA and second pixel circuit PCB, two pixel circuits adjacent in the first direction (e.g., the x direction) may form a pair of pixel circuits.

A [1,1]-th pixel circuit PC11, a [1,3]-th pixel circuit PC13, a [1,5]-th pixel circuit PC15, a [2,1]-th pixel circuit PC21, a [2,3]-th pixel circuit PC23, and a [2,5]-th pixel circuit PC25 may be electrically connected to the first gate line GLA (see FIG. 2), and a [1,2]-th pixel circuit PC12, a [1,4]-th pixel circuit PC14, a [2,2]-th pixel circuit PC22, and a [2,4]-th pixel circuit PC24 may be electrically connected to the second gate line GLB (see FIG. 2).

Each pixel circuit PCij may be electrically connected to a corresponding pixel electrode PEij. As an example, the [1,1]-th pixel circuit PC11 may be electrically connected to a [1,1]-th pixel electrode PE11, and the [1,2]-th pixel circuit PC12 may be electrically connected to a [1,2]-th pixel electrode PE12.

Each pixel electrode PEij may include an electrode body BP and a connector CP electrically connecting the electrode body BP to a corresponding pixel circuit PCij. An emission area EA of the light-emitting diode may be defined in the electrode body BP of each pixel electrode PEij.

Pixel circuits arranged in the same column may share the data line, and emission areas EA of the light-emitting diodes electrically connected to the pixel circuits arranged in the same column may be configured to emit light of the same color. As an example, the [1,1]-th pixel circuit PC11 and the [2,1]-th pixel circuit PC21 may share the first data line, a [1,1]-th light-emitting diode including a [1,1]-th pixel electrode PE11 and a [2,1]-th light-emitting diode including a [2,1]-th pixel electrode PE21 may be configured to emit red light.

The [1,2]-th pixel circuit PC12 and the [2,2]-th pixel circuit PC22 may share the second data line, a [1,2]-th light-emitting diode including a [1,2]-th pixel electrode PE12 and a [2,2]-th light-emitting diode including a [2,2]-th pixel electrode PE22 may be configured to emit blue light.

The [1,3]-th pixel circuit PC13 and the [2,3]-th pixel circuit PC23 may share the third data line, a [1,3]-th light-emitting diode including a [1,3]-th pixel electrode PE13 and a [2,3]-th light-emitting diode including a [2,3]-th pixel electrode PE23 may be configured to emit green light.

The [1,4]-th pixel circuit PC14 and the [2,4]-th pixel circuit PC24 may share the fourth data line, a [1,4]-th light-emitting diode including a [1,4]-th pixel electrode PE14 and a [2,4]-th light-emitting diode including a [2,4]-th pixel electrode PE24 may be configured to emit green light. Here, the first data line and the second data line may be connected to the same output line, and the third data line and the fourth data line may be connected to the same output line.

In some of the pixel electrodes PEij, a corresponding pixel circuit PCij may overlap the electrode body BP, and in others of the pixel electrodes PEij, a corresponding pixel circuit PCij may be spaced apart from the electrode body BP.

As an example, an electrode body BP of the [1,1]-th pixel electrode PE11 may be spaced apart from the [1,1]-th pixel circuit PC11, and an electrode body BP of the [1,2]-th pixel electrode PE12 may be spaced apart from the [1,2]-th pixel circuit PC12. In contrast, an electrode body BP of the [2,1]-th pixel electrode PE21 may overlap the [2,1]-th pixel circuit PC21, and an electrode body BP of the [2,2]-th pixel electrode PE22 may overlap the [2,2]-th pixel circuit PC22. Accordingly, a connector CP of the [1,1]-th pixel electrode PE11 may be longer than a connector CP of the [2,1]-th pixel electrode PE21, and a connector CP of the [1,2]-th pixel electrode PE12 may be longer than a connector CP of the [2,2]-th pixel electrode PE22.

Likewise, an electrode body BP of the [1,3]-th pixel electrode PE13 may overlap the [1,3]-th pixel circuit PC13, and an electrode body BP of the [2,4]-th pixel electrode PE24 may overlap the [2,4]-th pixel circuit PC24. In contrast, an electrode body BP of the [1,4]-th pixel electrode PE14 may be spaced apart from the [1,4]-th pixel circuit PC14, and an electrode body BP of the [2,3]-th pixel electrode PE23 may be spaced apart from the [2,3]-th pixel circuit PC23. Accordingly, a connector CP of each of the [1,3]-th pixel electrode PE13 and the [2,4]-th pixel electrode PE24 may be shorter than a connector CP of each of the [1,4]-th pixel electrode PE14 and the [2,3]-th pixel electrode PE23.

To reduce a difference in a parasitic capacitance between the pixel electrodes PEij due to a difference in the length and shape of the connectors CP, some pixel electrodes may further include a dummy portion. As an example, the [1,3]-th pixel electrode PE13 may include a first dummy portion DP1 having a shape corresponding to (e.g., a shape that is at least similar to) at least a portion of the connector CP of the [1,4]-th pixel electrode PE14. Here, when the first dummy portion DP1 of the [1,3]-th pixel electrode PE13 has a shape corresponding to (e.g., a shape that is at least similar to) at least a portion of the connector CP of the [1,4]-th pixel electrode PE14, it represents that the first dummy portion DP1 of the [1,3]-th pixel electrode PE13 has a shape equal or similar to at least a portion of the connector CP of the [1,4]-th pixel electrode PE14. By the first dummy portion DP1 of the [1,3]-th pixel electrode PE13, the [1,3]-th pixel electrode PE13 may form a parasitic capacitance similar to a parasitic capacitance formed by the [1,4]-th pixel electrode PE14 and peripheral elements. The [2,1]-th pixel electrode PE21 may include a second dummy portion DP2 having a shape corresponding to (e.g., a shape that is at least similar to) at least a portion of the connector CP of the [1,1]-th pixel electrode PE11, and the [2,2]-th pixel electrode PE22 may include a third dummy portion DP3 having a shape corresponding to (e.g., a shape that is at least similar to) at least a portion of the connector CP of the [1,2]-th pixel electrode PE12. The [1,3]-th pixel circuit PC13 and the [2,3]-th pixel circuit PC23 may be electrically connected to the third data line, and the [1,4]-th pixel circuit PC14 and the [2,4]-th pixel circuit PC24 may be electrically connected to the fourth data line.

The [1,4]-th pixel electrode PE14 electrically connected to the [1,4]-th pixel circuit PC14 may include a body BP and an extension CP extending from the body BP and electrically connected to the [1,4]-th pixel circuit PC14 through a contact hole. The [1,3]-th pixel electrode PE13 electrically connected to the [1,3]-th pixel circuit PC13 may include a body BP, an extension CP extending from the body BP and electrically connected to the [1,3]-th pixel circuit PC13 through a contact hole, and a first dummy portion DP1. The first dummy portion DP1 of the [1,3]-th pixel circuit PC13 may have a shape corresponding to (e.g., a shape that is at least similar to) at least a portion of the connector CP of the [1,4]-th pixel electrode PE14.

The [2,3]-th pixel electrode PE23 electrically connected to the [2,3]-th pixel circuit PC23 may include a body BP and an extension CP extending from the body BP and electrically connected to the [2,3]-th pixel circuit PC23 through a contact hole. The [2,4]-th pixel electrode PE24 electrically connected to the [2,4]-th pixel circuit PC24 may include a body BP, an extension CP extending from the body BP and electrically connected to the [2,4]-th pixel circuit PC24 through a contact hole, and a first dummy portion DP1. The first dummy portion DP1 of the [2,4]-th pixel circuit PC24 may have a shape corresponding to (e.g., a shape that is at least similar to) at least a portion of the connector CP of the [2,3]-th pixel electrode PE23. Accordingly, a deviation in brightness between pixels arranged in the same row and configured to emit light of the same color may be reduced.

The shape of the [1,3]-th pixel electrode PE13 may be symmetrical with respect to the shape of the [2,4]-th pixel electrode PE24 about a virtual line extending in the second direction (e.g., the y direction). The shape of the [1,4]-th pixel electrode PE14 may be symmetrical with respect to the shape of the [2,3]-th pixel electrode PE23 about a virtual line extending in the second direction (e.g., the y direction).

The [1,1]-th pixel circuit and the [2,1]-th pixel circuit may be electrically connected to the first data line and be adjacent in the second direction (e.g., the y direction). The [1,1]-th pixel electrode PE11 electrically connected to the [1,1]-th pixel circuit PC11 may include a body BP and an extension CP extending from the body BP and electrically connected to the [1,1]-th pixel circuit PC11 through a contact hole. The [2,1]-th pixel electrode PE21 electrically connected to the [2,1]-th pixel circuit PC21 may include a body BP, an extension CP extending from the body BP and electrically connected to the [2,1]-th pixel circuit PC21 through a contact hole, and a second dummy portion DP2. The second dummy portion DP2 of the [2,1]-th pixel circuit PC21 may have a shape corresponding to (e.g., a shape that is at least similar to) at least a portion of the connector CP of the [1,1]-th pixel electrode PE11.

The [1,2]-th pixel circuit and the [2,2]-th pixel circuit may be electrically connected to the second data line and be adjacent in the second direction (e.g., the y direction). The [1,2]-th pixel electrode PE12 electrically connected to the [1,2]-th pixel circuit PC12 may include a body BP and an extension CP extending from the body BP and electrically connected to the [1,2]-th pixel circuit PC12 through a contact hole. The [2,2]-th pixel electrode PE22 electrically connected to the [2,2]-th pixel circuit PC22 may include a body BP, an extension CP extending from the body BP and electrically connected to the [2,2]-th pixel circuit PC22 through a contact hole, and a third dummy portion DP3. The third dummy portion DP3 of the [2,2]-th pixel circuit PC22 may have a shape corresponding to (e.g., a shape that is at least similar to) at least a portion of the connector CP of the [1,2]-th pixel electrode PE12. Accordingly, a deviation in brightness between pixels arranged in adjacent columns and configured to emit light of the same color may be reduced.

A body BP of the [1,1]-th pixel electrode PE11 and a body BP of the [2,1]-th pixel electrode PE21 may be arranged in a staggered manner with respect to a virtual line extending in the second direction (e.g., the y direction). Likewise, a body BP of the [1,2]-th pixel electrode PE12 and a body BP of the [2,2]-th pixel electrode PE22 may be arranged in a staggered manner with respect to a virtual line extending in the second direction (e.g., the y direction).

Figure 15:
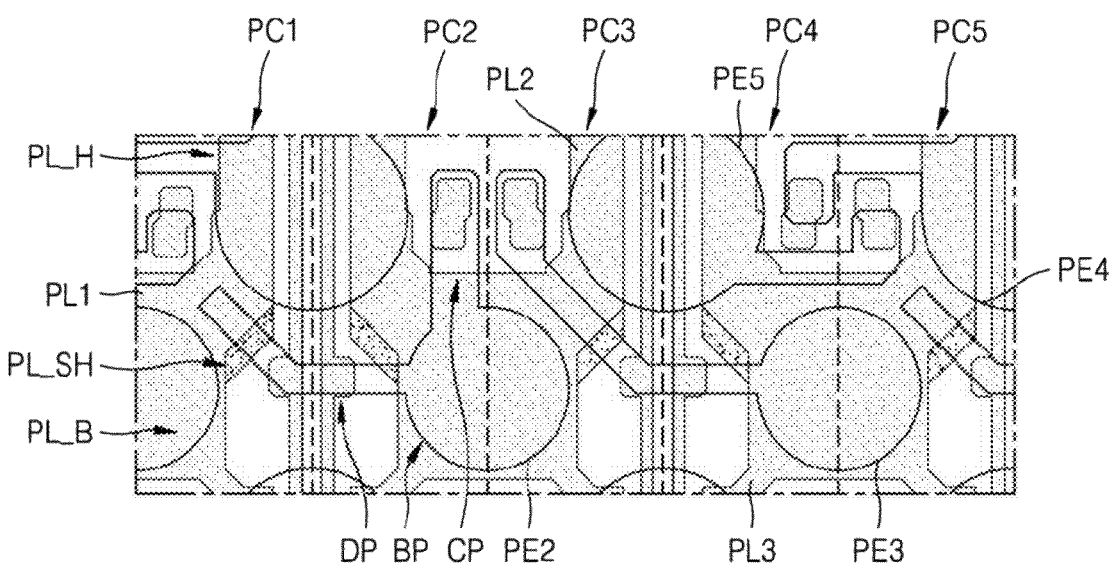
FIG. 15 is a schematic layout diagram of pixel electrodes and driving voltage lines according to an embodiment.

FIG. 15 is a schematic layout diagram of pixel electrodes and driving voltage lines according to an embodiment.

Referring to FIG. 15, the display apparatus may include a plurality of pixel circuits PC1, PC2, PC3, PC4, and PC5 arranged in the first direction (e.g., the x direction). Two pixel circuits adjacent to each other in the first direction (e.g., the x direction) may form a pair of pixel circuits. The second pixel circuit PC2 and the third pixel circuit PC3 may form a pair of pixel circuits, and the fourth pixel circuit PC4 and the fifth pixel circuit PC5 may form a pair of pixel circuits.

The first pixel circuit PC1, the third pixel circuit PC3, and the fifth pixel circuit PC5 may be connected to the second gate line GLB (see FIG. 2), and the second pixel circuit PC2 and the fourth pixel circuit PC5 may be electrically connected to the first gate line GLA (see FIG. 2).

The pixel circuits PC1, PC2, PC3, PC4, and PC5 may include driving voltage lines PL1, PL2, and PL3. One driving voltage line may overlap two adjacent pixel circuits. As an example, the second driving voltage line PL2 may overlap the second pixel circuit PC2 and the third pixel circuit PC3, and the third driving voltage line PL3 may overlap the fourth pixel circuit PC4 and the fifth pixel circuit PC5. The first driving voltage line PL1 may overlap the first pixel circuit PC1 and a pixel circuit arranged on the left (e.g., an x direction) of the first pixel circuit PC1.

Each of the driving voltage lines PL1, PL2, and PL3 may include a second body PL_B and a shield PL_SH. Each of the driving voltage lines PL1, PL2, and PL3 may define a second hole PLh.

The pixel electrodes PE2, PE3, PE4, and PE5 may be disposed on the pixel circuits PC1, PC2, PC3, PC4, and PC5. The second pixel electrode PE2 may be electrically connected to the second pixel circuit PC2, the third pixel electrode PE3 may be electrically connected to the third pixel circuit PC3, the fourth pixel electrode PE4 may be electrically connected to the fourth pixel circuit PC4, and the fifth pixel electrode PE5 may be electrically connected to the fifth pixel circuit PC5.

The pixel electrodes PE2, PE3, PE4, and PE5 may include a body BP and a connector CP extending from the body BP and connected to a corresponding pixel circuit. Each of the connectors CP may extend from the body BP to a connection electrode located inside the second hole PLh. Among the pixel electrodes PE2, PE3, PE4, and PE5, pixel electrodes overlapping corresponding pixel circuits, for example, the second pixel electrode PE2 may further include a dummy portion DP.

In an embodiment, the second body PL_B of the second driving voltage line PL2 may overlap the electrode body BP of the second pixel electrode PE2, and the second body PL_B of the second driving voltage line PL2 may overlap the electrode body BP of the third pixel electrode PE3.

A connector CP of the third pixel electrode PE3 may extend to a connection electrode of the third pixel circuit PC3 located inside the second hole PLh of the second driving voltage line PL2. The second pixel electrode PE2 may further include a dummy portion DP having a shape corresponding to (e.g., a shape that is at least similar to) at least a portion of the connector CP of the third pixel electrode PE3 such that a parasitic capacitance value of the third pixel electrode PE3 and a parasitic capacitance value of the second pixel electrode PE2 are substantially the same.

The first driving voltage line PL1 may include a shield PL_SH overlapping the dummy portion DP of the second pixel electrode PE2, and the second driving voltage line PL2 may include a shield PL_SH overlapping the connector DP of the third pixel electrode PE3 such that a parasitic capacitance value of the second pixel electrode PE32 and a parasitic capacitance value of the third pixel electrode PE3 are substantially the same. For example, the display apparatus configured to display high-quality images may be provided by adjusting the areas of the shields PL_SH of the driving voltage lines PL1, PL2, and PL3 and further reducing a deviation in brightness between pixels.

According to embodiments, manufacturing costs of the display apparatus may be reduced by reducing the number of output lines of a data driver. In addition, according to embodiments, a display apparatus with reduced deviation in brightness between pixels and configured to display high-quality images may be provided. However, the scope of the disclosure is not necessarily limited by this effect.

It should be understood that embodiments described herein should be considered in a descriptive sense and not necessarily for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure.

What is claimed is:

1. A display apparatus, comprising:
   a first pixel circuit including a first driving transistor and a first data-write transistor;
   a second pixel circuit including a second driving transistor and a second data-write transistor;
   a first gate line and a second gate line each extending primarily in a first direction;

a first data line extending primarily in a second direction crossing the first direction and configured to transfer a first data signal to the first data-write transistor;
   a second data line extending primarily in the second direction and configured to transfer a second data signal to the second data-write transistor;
   a first branch electrode electrically connecting the first gate line to a gate electrode of the first data-write transistor; and
   a second branch electrode electrically connecting the second gate line to a gate electrode of the second data-write transistor,
   wherein the first pixel circuit and the second pixel circuit are adjacent to each other in the first direction.

2. The display apparatus of claim 1, further comprising:
   a data driver configured to output data signals through a first output line;
   a data switch including a first switch and a second switch, wherein the first switch connects the first output line to the first data line in response to a first control signal, and the second switch connects the first output line to the second data line in response to a second control signal; and
   a controller configured to alternately output the first control signal and the second control signal for each line time of one frame.

3. The display apparatus of claim 2, wherein a first gate signal applied to the first gate line is synchronized with the first control signal, and a second gate signal applied to the second gate line is synchronized with the second control signal.

4. The display apparatus of claim 2, wherein the data driver is configured to output a first data signal in synchronization with an output timing of the first control signal and output a second data signal in synchronization with an output timing of the second control signal.

5. The display apparatus of claim 1, further comprising:
   a third pixel circuit adjacent to the first pixel circuit in the second direction and sharing the first data line with the first pixel circuit;
   a fourth pixel circuit adjacent to the second pixel circuit in the second direction, sharing the second data line with the second pixel circuit, and arranged in a same row as the third pixel circuit;
   a first light-emitting diode electrically connected to the first pixel circuit;
   a second light-emitting diode electrically connected to the second pixel circuit;
   a third light-emitting diode electrically connected to the third pixel circuit; and
   a fourth light-emitting diode electrically connected to the fourth pixel circuit,
   wherein the first light-emitting diode is configured to emit light of a same color as the third light-emitting diode, and the second light-emitting diode is configured to emit light of a same color as the fourth light-emitting diode.

6. The display apparatus of claim 5, wherein the first light-emitting diode and the third light-emitting diode are configured to emit light of a first color, and the second light-emitting diode and the fourth light-emitting diode are configured to emit light of a second color that is different from the first color.

7. The display apparatus of claim 6, wherein an emission area of the first light-emitting diode overlaps the first pixel circuit, and an emission area of the second light-emitting diode overlaps the second pixel circuit, and wherein an emission area of the third light-emitting diode is spaced apart from the third pixel circuit, and an emission area of the fourth light-emitting diode is spaced apart from the fourth pixel circuit.

8. The display apparatus of claim 7, wherein each of the first light-emitting diode, the second light-emitting diode, the third light-emitting diode, and the fourth light-emitting diode includes a pixel electrode including a body and a connector extending from the body to a corresponding pixel circuit, wherein a pixel electrode of the first light-emitting diode further includes a first dummy portion corresponding to a shape of a connector of the third light-emitting diode, and wherein a pixel electrode of the second light-emitting diode further includes a second dummy portion corresponding to a shape of a connector of the fourth light-emitting diode.

9. The display apparatus of claim 5, wherein the first light-emitting diode and the second light-emitting diode are each configured to emit light of a third color.

10. The display apparatus of claim 9, wherein an emission area of the first light-emitting diode overlaps the first pixel circuit, an emission area of the second light-emitting diode is spaced apart from the second pixel circuit, and wherein an emission area of the third light-emitting diode is spaced apart from the third pixel circuit, and an emission area of the fourth light-emitting diode overlaps the fourth pixel circuit.

11. The display apparatus of claim 10, wherein each of the first light-emitting diode, the second light-emitting diode, the third light-emitting diode, and the fourth light-emitting diode includes a pixel electrode including a body and a connector extending from the body to a corresponding pixel circuit, wherein a pixel electrode of the first light-emitting diode further includes a first dummy portion corresponding to a shape of a connector of the second light-emitting diode, and wherein a pixel electrode of the fourth light-emitting diode further includes a second dummy portion corresponding to a shape of a connector of the third light-emitting diode.

12. The display apparatus of claim 5, wherein the third pixel circuit includes a third driving transistor, a third data-write transistor, and a first initialization transistor connected between the third driving transistor and an initialization voltage line, wherein the fourth pixel circuit includes a fourth driving transistor, a fourth data-write transistor, and a second initialization transistor connected between the fourth driving transistor and the initialization voltage line, wherein the first branch electrode electrically connects the first gate line to a gate electrode of the first initialization transistor, and wherein the second branch electrode electrically connects the second gate line to a gate electrode of the second initialization transistor.

13. The display apparatus of claim 12, wherein the gate electrode of the first initialization transistor and the gate electrode of the second initialization transistor are disposed between the first gate line and the second gate line.

14. The display apparatus of claim 12, wherein the gate electrode of the first data-write transistor, the gate electrode of the second data-write transistor, the gate electrode of the first initialization transistor, and the gate electrode of the second initialization transistor each have an island shape.

15. The display apparatus of claim 1, wherein the second gate line has a zigzag shape.

16. The display apparatus of claim 15, wherein a resistance of the first gate line is equal to a resistance of the second gate line.

17. A display apparatus, comprising:

a first semiconductor layer including a first semiconductor pattern and a second semiconductor pattern spaced apart from each other in a first direction and symmetrical with respect to each other about a virtual line extending in a second direction crossing the first direction;

a first conductive layer disposed on the first semiconductor layer and including a first gate electrode and a second gate electrode, wherein the first gate electrode overlaps the first semiconductor pattern and the second gate electrode overlaps the second semiconductor pattern;

a second conductive layer disposed on the first conductive layer and including a first gate line and a second gate line each extending primarily in the first direction;

a second semiconductor layer disposed on the second conductive layer;

a third conductive layer disposed on the second semiconductor layer;

a fourth conductive layer disposed on the third conductive layer and including a first branch electrode and a second branch electrode, wherein the first branch electrode electrically connects the first gate line to the first gate electrode, and the second branch electrode electrically connects the second gate line to the second gate electrode; and a fifth conductive layer disposed on the fourth conductive layer and including a first data line and a second data line each extending primarily in the second direction.

18. The display apparatus of claim 17, further comprising:

a data driver configured to output data signals through a first output line;

a data switch including a first switch and a second switch, wherein the first switch connects the first output line to the first data line in response to a first control signal, and the second switch connects the first output line to the second data line in response to a second control signal; and a controller configured to alternately output the first control signal and the second control signal for each line time of one frame.

19. The display apparatus of claim 18, wherein a first gate signal applied to the first gate line is synchronized with the first control signal, and a second gate signal applied to the second gate line is synchronized with the second control signal.

20. The display apparatus of claim 17, wherein the second gate line has a zigzag shape.

21. The display apparatus of claim 20, wherein a resistance of the first gate line is equal to a resistance of the second gate line.

22. The display apparatus of claim 17, further comprising a fifth conductive layer disposed on the fourth conductive layer and including a first pixel electrode electrically connected to the first semiconductor pattern and a second pixel electrode electrically connected to the second semiconductor pattern, wherein, when the first pixel electrode overlaps the first semiconductor pattern, the first pixel electrode includes a body, a connector extending from the body, and a dummy portion.

23. The display apparatus of claim 22, wherein the fourth conductive layer further includes a driving voltage line extending primarily in the second direction, and the first pixel electrode overlaps the driving voltage line.

24. The display apparatus of claim 23, wherein the second pixel electrode includes a body and a connector extending from the body, and the driving voltage line includes a shield overlapping the connector of the first pixel electrode.

25. A display apparatus, comprising:

a first data line and a second data line each extending primarily in a first direction;

a first pixel circuit electrically connected to the first data line;

a second pixel circuit electrically connected to the second data line;

a first pixel electrode including a first body and a first connector extending from the first body and electrically connected to the first pixel circuit; and a second pixel electrode including a second body, a second connector extending from the second body and electrically connected to the second pixel circuit, and a first dummy portion having a shape corresponding to at least a portion of the first connector, wherein the first pixel circuit and the second pixel circuit are adjacent to each other in the first direction.

26. The display apparatus of claim 25, further comprising:

a third pixel circuit electrically connected to the first data line;

a fourth pixel circuit electrically connected to the second data line;

a third pixel electrode including a third body, a third connector extending from the third body and electrically connected to the third pixel circuit, and a second dummy portion; and a fourth pixel electrode including a fourth body and a fourth connector extending from the fourth body and electrically connected to the fourth pixel circuit, wherein the second dummy portion has a shape corresponding to at least a portion of the fourth connector.

27. The display apparatus of claim 26, wherein a shape of the first pixel electrode and a shape of the fourth pixel electrode are symmetrical with respect to each other about a virtual line extending in the first direction, and wherein a shape of the second pixel electrode and a shape of the third pixel electrode are symmetrical with respect to each other about the virtual line.

28. A display apparatus, comprising:

a first data line extending primarily in a first direction;

a first pixel circuit and a second pixel circuit each electrically connected to the first data line and adjacent to each other in the first direction;

a first pixel electrode including a first body and a first connector extending from the first body and electrically connected to the first pixel circuit; and a second pixel electrode including a second body, a second connector extending from the second body and electrically connected to the second pixel circuit, and a first dummy portion having a shape corresponding to at least a portion of the first connector.

29. The display apparatus of claim 28, wherein the first body of the first pixel electrode and the second body of the second pixel electrode are arranged in a staggered manner with respect to a virtual line extending in the first direction.

\* \* \* \* \*